US010981455B2

(12) United States Patent
Otsuki et al.

(10) Patent No.: US 10,981,455 B2
(45) Date of Patent: Apr. 20, 2021

(54) ELECTRIC VEHICLE

(71) Applicant: Honda Motor Co., Ltd., Tokyo (JP)

(72) Inventors: Yuto Otsuki, Saitama (JP); Hirokazu Oguma, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 214 days.

(21) Appl. No.: 16/240,799

(22) Filed: Jan. 7, 2019

(65) Prior Publication Data

US 2019/0210474 A1 Jul. 11, 2019

(30) Foreign Application Priority Data

Jan. 10, 2018 (JP) .............................. JP2018-002240

(51) Int. Cl.
*B60L 50/60* (2019.01)
*B60L 53/22* (2019.01)
(Continued)

(52) U.S. Cl.
CPC ............... *B60L 50/66* (2019.02); *B60L 50/40* (2019.02); *B60L 50/51* (2019.02); *B60L 53/22* (2019.02);
(Continued)

(58) Field of Classification Search
None
See application file for complete search history.

(56) References Cited

U.S. PATENT DOCUMENTS 7,977,812 B2 * 7/2011 Senda .................. H02J 7/1423
307/10.1
10,666,045 B2 * 5/2020 Gemin .................... B60L 58/40
(Continued)

FOREIGN PATENT DOCUMENTS

JP 2015057939 3/2015
JP 2016131483 7/2016
(Continued)

OTHER PUBLICATIONS

"Office Action of Japan Counterpart Application," with English translation thereof, dated Oct. 15, 2019, p. 1-p. 6.
(Continued)

*Primary Examiner* — Jared Fureman
*Assistant Examiner* — Joel Barnett
(74) *Attorney, Agent, or Firm* — JCIPRNET

(57) ABSTRACT

The electric vehicle includes a first battery, a second battery having an output weight density higher than that of the first battery and an energy weight density lower than that of the first battery, a motor generator, an electric power conversion circuit, and a control device for controlling the electric power conversion circuit. The control device controls the electric power conversion circuit so that, during a powering operation of the motor generator, at least a part of electric power necessary for changing a vehicle speed among requested electric power is discharged from the second battery, and remaining electric power obtained by subtracting the electric power discharged from the second battery from the requested electric power is discharged from the first battery; and it controls the electric power conversion circuit so that, during a regenerative operation of the motor generator, electric power generated is charged to the second battery.

18 Claims, 14 Drawing Sheets

(51) Int. Cl.
  B60L 50/40 (2019.01)
  B60L 50/51 (2019.01)
  G01R 19/165 (2006.01)
  B60L 58/13 (2019.01)
  H02J 7/34 (2006.01)

(52) U.S. Cl.
  CPC ........ B60L 58/13 (2019.02); G01R 19/16542 (2013.01); H02J 7/345 (2013.01)

(56) References Cited

U.S. PATENT DOCUMENTS

| | | | |
|---|---|---|---|
| 2010/0096918 A1* | 4/2010 | Sawada | ................ B60L 7/14 307/9.1 |
| 2015/0202978 A1* | 7/2015 | Hatanaka | ............ B60L 7/26 701/19 |
| 2015/0202985 A1* | 7/2015 | Le | ................. B60L 15/2009 307/9.1 |

FOREIGN PATENT DOCUMENTS

| | | |
|---|---|---|
| JP | 2017112809 | 6/2017 |
| JP | 2017125699 | 7/2017 |
| JP | 2017210040 | 11/2017 |
| WO | 2012111508 | 8/2012 |

OTHER PUBLICATIONS

Office Action of Japan Counterpart Application, with English translation thereof, dated Jun. 18, 2019, pp. 1-7.

\* cited by examiner

ELECTRIC VEHICLE

CROSS-REFERENCE TO RELATED APPLICATION

This application claims the priority benefit of Japan Application No. 2018-002240, filed on Jan. 10, 2018. The entirety of the above-mentioned patent application is hereby incorporated by reference herein and made a part of this specification.

BACKGROUND

Technical Field

The disclosure relates to an electric vehicle. More specifically, the disclosure relates to an electric vehicle including two types of electric storage devices, i.e. a first electric storage device of a capacitive type and a second electric storage device of an output type having an output weight density higher than that of the first electric storage device and an energy weight density lower than that of the first electric storage device.

Description of Related Art

In recent years, there has been a prosperous development of electric vehicles such as electric transportation machines including an electric motor as a power generation source, hybrid vehicles including an electric motor and an internal combustion engine as power generation sources, etc. Electric storage devices such as batteries and capacitors are also installed in such electric vehicles for supplying electric energy to the electric motor. Also, in recent years, in terms of electric vehicles installed with electric storage devices, the ones installed with multiple electric storage devices having different charge and discharge characteristics have also been developed.

For example, Patent Document 1 shows an electric vehicle including a battery and a capacitor. Generally, batteries are superior to capacitors in energy weight density, and capacitors are superior to batteries in output weight density. In the technique of Patent Document 1, in order to make full use of the charge and discharge characteristics of the battery and the capacitor, in a case where the vehicle is traveling on a flat road, the battery is preferentially selected as a power source of the electric motor, and in a case where the vehicle is traveling on a continuous uphill/downhill road with repeated charges and discharges, the capacitor is preferentially selected as the power source of the electric motor. Further, the electric power generated by the electric motor during the traveling on the continuous uphill/downhill road is supplied to one of the capacitor and the battery selected according to the charge rate.

When a first electric storage device of a capacitive type having good energy weight density and a second electric storage device of an output type having good output weight density are installed in a vehicle, as in the technique of Patent Document 1, it is preferable to supply electric power from the second electric storage device of the output type to the electric motor when acceleration is requested. For this reason, it is preferable that in a case where the driver gives a request for acceleration, the electric power can be supplied from the second electric storage device according to this request, and in a case where it is turned to deceleration, the electric power generated by the electric motor can be received by the second electric storage device, and in this way, the charge rate of the second electric storage device can be maintained within a target range between a predetermined upper and lower limit.

However, in Patent Document 1, it is not sufficiently studied how to maintain the charge rate of the second electric storage device of the output type within the target range. Further, in the vehicle including the first electric storage device and the second electric storage device, in a case where the charge rate of the second electric storage device decreases, it is also conceivable to charge the second electric storage device with the electric power of the first electric storage device. However, since a considerable loss occurs when an electric power transfer between the electric storage devices is performed, it is preferable to avoid such electric power transfer between the electric storage devices as much as possible.

[Patent Document 1] Japanese Laid-open No. 2015-57939

SUMMARY

It is an object of the disclosure to provide an electric vehicle capable of maintaining the charge rate of the second electric storage device within a predetermined range while avoiding the electric power transfer between the first electric storage device of the capacitive type and the second electric storage device of the output type as much as possible.

(1) An electric vehicle (such as the vehicle V described below) of the disclosure is characterized in including a first electric storage device (such as the first battery ESE described below); a second electric storage device (such as the second battery ESP described below) having an output weight density higher than that of the first electric storage device and an energy weight density lower than that of the first electric storage device; a motor generator (such as the motor generator M described below) connected to a drive wheel (such as the drive wheel W described below); an electric power conversion circuit (such as the electric power conversion circuit 3 described below) which is provided with power lines for connecting the first electric storage device and the second electric storage device to the motor generator; a control device (such as the control device 5 described below) for driving the electric power conversion circuit and controlling charges and discharges of the first electric storage device and the second electric storage device; and a requested electric power calculation part (such as the electric power calculation part 74 described below) for calculating requested electric power which is electric power requested by discharging all the electric storage devices including the first electric storage device and the second electric storage device during a powering operation of the motor generator, wherein the control device drives the electric power conversion circuit so that, during the powering operation, at least a part of electric power (such as the inertial electric power Pin described below) necessary for changing a vehicle speed among the requested electric power is discharged from the second electric storage device, and remaining electric power obtained by subtracting the electric power discharged from the second electric storage device from the requested electric power is discharged from the first electric storage device and drives the electric power conversion circuit so that, during a regenerative operation of the motor generator, electric power generated by the motor generator is charged to the second electric storage device.

DESCRIPTION OF THE EMBODIMENTS

Figure 1:
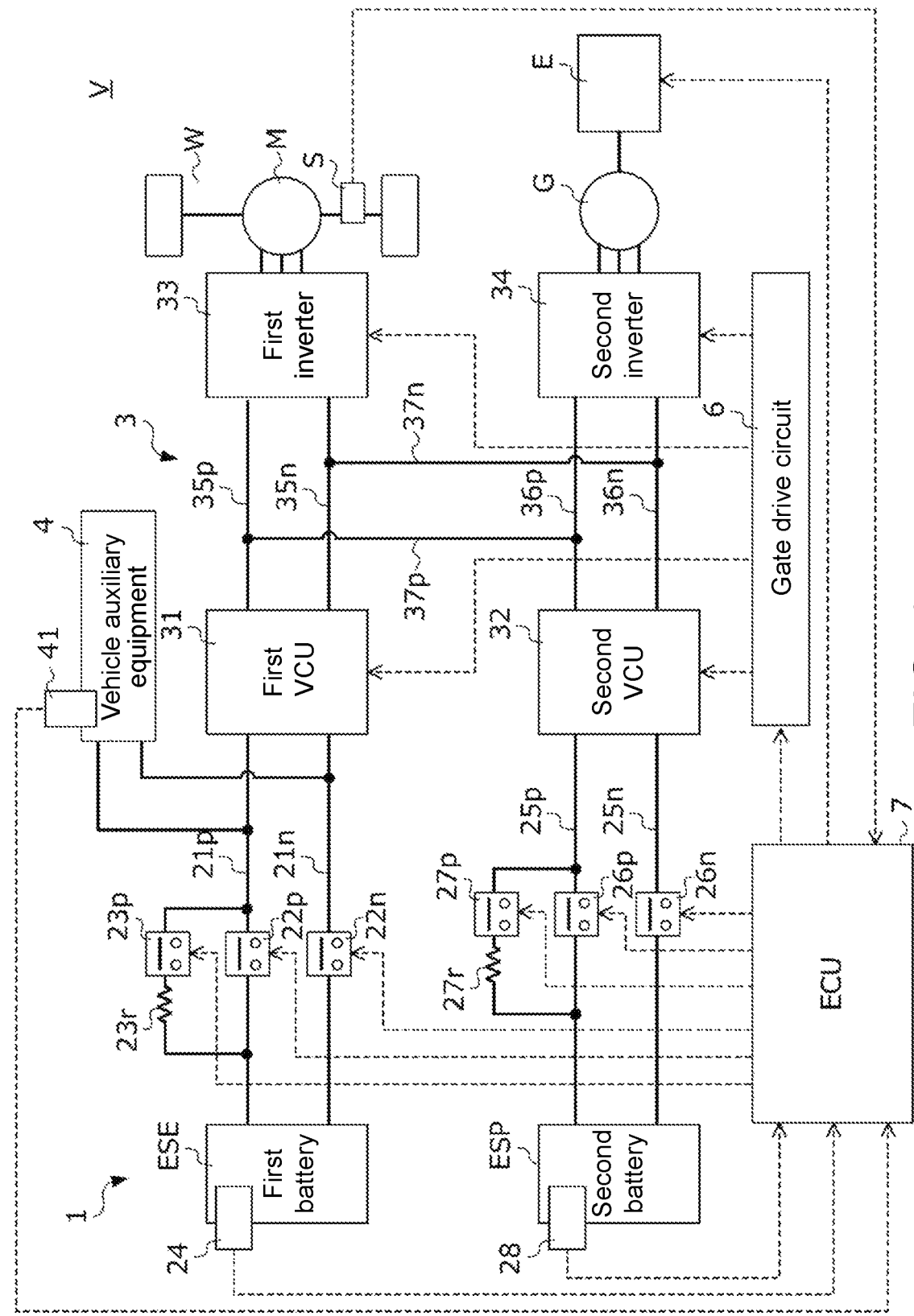
FIG. 1 is a diagram showing a configuration of an electric vehicle according to an embodiment of the disclosure.

Solution to the Problem (1) An electric vehicle (such as the vehicle V described below) of the disclosure is characterized in including a first electric storage device (such as the first battery ESE described below); a second electric storage device (such as the second battery ESP described below) having an output weight density higher than that of the first electric storage device and an energy weight density lower than that of the first electric storage device; a motor generator (such as the motor generator M described below) connected to a drive wheel (such as the drive wheel W described below); an electric power conversion circuit (such as the electric power conversion circuit 3 described below) which is provided with power lines for connecting the first electric storage device and the second electric storage device to the motor generator; a control device (such as the control device 5 described below) for driving the electric power conversion circuit and controlling charges and discharges of the first electric storage device and the second electric storage device; and a requested electric power calculation part (such as the electric power calculation part 74 described below) for calculating requested electric power which is electric power requested by discharging all the electric storage devices including the first electric storage device and the second electric storage device during a powering operation of the motor generator, wherein the control device drives the electric power conversion circuit so that, during the powering operation, at least a part of electric power (such as the inertial electric power Pin described below) necessary for changing a vehicle speed among the requested electric power is discharged from the second electric storage device, and remaining electric power obtained by subtracting the electric power discharged from the second electric storage device from the requested electric power is discharged from the first electric storage device and drives the electric power conversion circuit so that, during a regenerative operation of the motor generator, electric power generated by the motor generator is charged to the second electric storage device.

(2) In this case, it is preferable that the electric vehicle includes a second charge state parameter obtaining part (such as the second charge state estimation part 71b described below) for obtaining a second charge state parameter value (such as the estimated value SOC2 of the charge rate of the second battery ESP described below) correlated with a charge state of the second electric storage device; and a burden rate setting part (such as the burden rate setting part 76 described below) for setting a burden rate (such as the burden rate k described below), which is a ratio of a burden share of the second electric storage device with respect to the electric power necessary for changing the vehicle speed, based on the second charge state parameter value, wherein the control device drives the electric power conversion circuit so that, during the powering operation, a share according to the burden rate among the electric power necessary for changing the vehicle speed is discharged from the second electric storage device.

(3) In this case, it is preferable that the burden rate setting part sets the burden rate to a greater value as the second charge state parameter value increases.

(4) In this case, it is preferable that the requested electric power calculation part calculates the requested electric power by summing inertial electric power (such as the inertial electric power Pin described below), which is electric power that needs to be supplied to the motor generator for changing the vehicle speed, cruise electric power (such as the cruise electric power Per described below), which is electric power that needs to be supplied to the motor generator for maintaining the vehicle speed, and auxiliary equipment electric power (such as the auxiliary equipment electric power Pho described below), which is electric power that needs to be supplied to vehicle auxiliary equipment.

(5) In this case, it is preferable that the electric vehicle includes an internal combustion engine (such as the engine E described below); and a generator (such as the generator G described below) which is connected to the first electric storage device via the electric power conversion circuit and generates electric power by using power generated by the internal combustion engine, wherein the control device drives the electric power conversion circuit so that, during electric power generation by the generator, the electric power generated by the generator is charged to the first electric storage device, and the first electric storage device is maintained at a predetermined charge state.

(6) In this case, it is preferable that the electric vehicle includes an internal combustion engine (such as the engine E described below); a generator (such as the generator G described below) which is connected to the first electric storage device via the electric power conversion circuit and generates electric power by using power generated by the internal combustion engine; and a second charge state parameter obtaining part (such as the second charge state estimation part 71b described below) for obtaining a second charge state parameter value (such as the estimated value SOC2 of the charge rate of the second battery ESP described below) correlated with a charge state of the second electric storage device, wherein the control device drives the electric power conversion circuit so that, in a case where the second charge state parameter value is less than or equal to a predetermined threshold value, at least one of the electric power generated by the generator and the electric power of the first electric storage device is charged to the second electric storage device.

(7) In this case, it is preferable that the requested electric power calculation part calculates the requested electric power by subtracting generated electric power, which is the electric power generated by the generator, from electric power obtained by summing inertial electric power (such as the inertial electric power Pin described below), which is electric power that needs to be supplied to the motor generator for changing the vehicle speed, cruise electric power (such as the cruise electric power Per described below), which is electric power that needs to be supplied to the motor generator for maintaining the vehicle speed, and auxiliary equipment electric power (such as the auxiliary equipment electric power Pho described below), which is electric power that needs to be supplied to vehicle auxiliary equipment.

(8) In this case, it is preferable that the electric vehicle further includes first power lines (such as the first power lines 21p and 21n described below) for connecting the first electric storage device and the electric power conversion circuit, wherein the vehicle auxiliary equipment is connected to the first power lines, and electric power necessary for driving the vehicle auxiliary equipment is supplied from the first electric storage device.

Effects (1) First, the balance of electric power during the period when the electric vehicle starts traveling from a stationary state until the electric vehicle becomes stationary again after the traveling is studied. For example, in order to accelerate the vehicle from the stationary state to a predetermined cruise speed, it is necessary to supply at least the electric power necessary for changing the vehicle speed and the electric power necessary for realizing a constant speed motion of the electric vehicle under the action of travel resistance, etc. from the electric storage devices to the motor generator. Here, "the electric power necessary for changing the vehicle speed" refers to, for example, the electric power necessary for realizing an acceleration motion of the electric vehicle in a state of ignoring the existence of the travel resistance which can act on the electric vehicle during the traveling, i.e. the electric power necessary for realizing an acceleration motion of a mass point having the same vehicle weight as the electric vehicle. Further, when the electric vehicle, after accelerating until the cruise speed as described above, decelerates from the cruise speed until it becomes stationary, electric power is generated by realizing a deceleration motion by the motor generator and can be recovered by the electric storage devices. Here, since the vehicle weight during the acceleration and the deceleration substantially has no change, the electric power necessary for changing the vehicle speed during the powering operation of the motor generator and the electric power generated by the motor generator during the regenerative operation are ideally substantially equal. However, since various losses, such as the loss caused by the brake, the loss due to electric power conversion, etc., occur during the regenerative operation, in reality, the electric power generated during the regenerative operation is smaller than the electric power necessary for changing the vehicle speed during the powering operation by the loss amount.

Therefore, in the electric vehicle of the disclosure, the control device of the electric power conversion circuit controls the electric power conversion circuit so that, during the powering operation, at least a part of the electric power necessary for changing the vehicle speed is discharged from the second electric storage device of an output type, and remaining electric power obtained by subtracting the burden share of the second electric storage device from the requested electric power with respect to all electric storage devices is discharged from the first electric storage device of a capacitive type; and it controls the electric power conversion circuit so that, during the regenerative operation, the electric power generated by the motor generator is charged to the second electric storage device. That is, at least a part of the electric power necessary for changing the vehicle speed is discharged from the second electric storage device during the powering operation, and the electric power generated by the motor generator is charged to the second electric storage device during the regenerative operation. As described above, the electric power generated during the regenerative operation is smaller than the electric power necessary for changing the vehicle speed during the powering operation by the loss amount. Therefore, in the electric vehicle of the disclosure, with this loss amount taken into consideration, not all but at least a part of the electric power necessary for changing the vehicle speed is discharged from the second electric storage device during the powering operation. Therefore, in the electric vehicle of the disclosure, the balance of the electric power of the second electric storage device during the period when the electric vehicle starts traveling from the stationary state until the electric vehicle becomes stationary after the traveling can be made substantially at 0 with various losses taken into consideration. Therefore, according to the electric vehicle of the disclosure, the charge rate of the second electric storage device of the output type can be maintained substantially at a certain value while avoiding the electric power transfer between the first electric storage device and the second electric storage device as much as possible.

(2) As described above, the electric power generated by the motor generator during the regenerative operation is smaller than the electric power necessary for changing the vehicle speed during the powering operation. Therefore, if all of the electric power necessary for changing the vehicle speed is borne by the second electric storage device during the powering operation, the balance of the electric power of the second electric storage device becomes minus by the loss amount, and the charge rate of the second electric storage device decreases. Therefore, in the electric vehicle of the disclosure, a burden rate with respect to the electric power necessary for changing the vehicle speed during the powering operation is calculated, and a share according to the burden rate among the electric power necessary for changing the vehicle speed is discharged from the second electric storage device during the powering operation, and the remaining electric power obtained by subtracting the burden share of the second electric storage device from the requested electric power is discharged from the first electric storage device. In this way, the balance of the electric power of the second electric storage device can be made close to 0. Further, in the electric vehicle of the disclosure, the burden rate is calculated based on the second charge state parameter value of the second electric storage device. In this way, even in a case where the balance of the electric power of the second electric storage device is outside 0, the charge rate of the second electric storage device can be prevented from falling significantly outside the predetermined target.

(3) The burden share of the second electric storage device increases as the burden rate increases; accordingly, the balance of the electric power of the second electric storage device is changed to the minus side, and the charge rate of the second electric storage device is changed to the decreasing side. Further, the burden share of the second electric storage device decreases as the burden rate decreases; accordingly, the balance of the electric power of the second electric storage device is changed to the plus side, and the charge rate of the second electric storage device is changed to the increasing side. Therefore, in the electric vehicle of the disclosure, the burden rate is set to a greater value as the second charge state parameter value of the second electric storage device increases. In this way, since the charge rate of the second electric storage device is maintained at the predetermined target, the balance of the electric power of the second electric storage device can be controlled.

(4) In the electric vehicle of the disclosure, the requested electric power is calculated by summing inertial electric power, which is electric power that needs to be supplied to the motor generator for changing the vehicle speed, cruise electric power, which is electric power that needs to be supplied to the motor generator for maintaining the vehicle speed under the action of the travel resistance, and auxiliary equipment electric power, which is electric power that needs to be supplied to vehicle auxiliary equipment. In this way, the electric power necessary for the vehicle during the powering operation can be covered by the first electric storage device and the second electric storage device while the balance of the electric power of the second electric storage device is being made close to 0.

(5) As described above, in the electric vehicle of the disclosure, since the electric power generated by the motor generator during the regenerative operation is charged to the second electric storage device, the charge rate of the first electric storage device tends to decrease. Therefore, in the electric vehicle of the disclosure, during electric power generation by a generator different from the motor generator, electric power generated by the generator using power of the internal combustion engine is charged to the first electric storage device, and the first electric storage device is maintained at a predetermined charge state. In this way, the charge rates of the first electric storage device and the second electric storage device can be maintained substantially at a certain value while avoiding the electric power transfer between the first electric storage device and the second electric storage device as much as possible.

(6) In the electric vehicle of the disclosure, though the balance of the electric power of the second electric storage device can be made substantially at 0, due to influences of control error and losses, the charge rate of the second electric storage device may gradually decrease in some cases. Therefore, in the electric vehicle of the disclosure, in a case where the second charge state parameter value of the second electric storage device is less than or equal to a predetermined threshold value, at least one of the electric power generated by the generator and the electric power of the first electric storage device is charged to the second electric storage device. In this way, it is possible to avoid a situation where the charge rate of the second electric storage device significantly decreases and cannot realize the acceleration according to a request of the driver.

(7) In the electric vehicle of the disclosure, the requested electric power is calculated by subtracting generated electric power, which is the electric power generated by the generator, from electric power obtained by summing inertial electric power, which is electric power that needs to be supplied to the motor generator for changing the vehicle speed, cruise electric power, which is electric power that needs to be supplied to the motor generator for maintaining the vehicle speed under the action of the travel resistance, and auxiliary equipment electric power, which is electric power that needs to be supplied to vehicle auxiliary equipment. In this way, the electric power necessary for the vehicle during the powering operation can be covered by the first electric storage device, the second electric storage device, and the generator while the balance of the electric power of the second electric storage device is being made close to 0.

(8) In the electric vehicle of the disclosure, the vehicle auxiliary equipment is connected to first power lines, which are for connecting the first electric storage device and the electric power conversion circuit, and the electric power necessary for driving the vehicle auxiliary equipment is supplied from the first electric storage device. In this way, it is possible to avoid a case where the electric power is supplied from the second electric storage device to the vehicle auxiliary equipment, the balance of the electric power of the second electric storage device is turned to the minus side, and thus the charge rate of the second electric storage device falls significantly below the predetermined target.

Hereinafter, an embodiment of the disclosure will be described with reference to the drawings.

FIG. 1 is a diagram showing a configuration of an electric vehicle V (hereinafter simply referred to as the "vehicle V") according to the present embodiment. The present embodiment describes a so-called hybrid vehicle including a motor generator M, an engine E, and a generator G as an example of the vehicle V, but the disclosure is not limited thereto. The electric vehicle according to the disclosure is not limited to the hybrid vehicle but can be applied to an electric automobile including the motor generator M but not including the engine E and the generator G.

The vehicle V includes a drive wheel W, the motor generator M, the engine E, the generator G, a speedometer S, and a power supply system 1.

The motor generator M mainly generates power for the vehicle V to travel. An output shaft of the motor generator M is connected to the drive wheel W. A torque generated by supplying electric power from the power supply system 1 to the motor generator M to cause the motor generator M to perform a powering operation is transmitted to the drive wheel W via a power transmission mechanism (not shown in the drawings), causes the drive wheel W to rotate, and causes the vehicle V to travel. In addition, the motor generator M acts as a generator by performing a regenerative operation during deceleration of the vehicle V. The electric power generated by the motor generator M during the regenerative operation is supplied to the power supply system 1.

An output shaft of the engine E is connected to the generator G. The generator G is driven by the power generated by the engine E to generate electric power. The electric power generated by the generator G is supplied to the power supply system 1.

The speedometer S generates a pulse signal corresponding to a rotation speed of the axle of the drive wheel W and transmits the pulse signal to an ECU 7 (to be described below) of the power supply system 1. The ECU 7 calculates a vehicle speed of the vehicle V based on the pulse signal transmitted from the speedometer S.

The power supply system 1 includes a first battery ESE, a second battery ESP different from the first battery ESE, an electric power conversion circuit 3 which is provided with power lines for connecting the first battery ESE and the second battery ESP to the motor generator M and the generator G, vehicle auxiliary equipment 4, and a control device 5 for controlling the electric power conversion circuit 3.

The first battery ESE is a secondary battery capable of both a discharge for converting chemical energy into electric energy and a charge for converting electric energy into chemical energy. The following describes a case of using a so-called lithium ion storage battery that performs a charge and a discharge by moving lithium ions between electrodes as the first battery ESE, but the disclosure is not limited thereto.

Positive and negative poles of the first battery ESE are connected to a first voltage converter 31 (to be described below) in the electric power conversion circuit 3 via first power lines 21$p$ and 21$n$, respectively. First contactors 22$p$ and 22$n$ are respectively provided in the first power lines 21$p$ and 21$n$ for connecting or disconnecting the first battery ESE and the first voltage converter 31.

The first contactors 22$p$ and 22$n$ are of a normally open type, which are opened to disconnect the connection between the first battery ESE and the first voltage converter 31 in a state where no command signal from the outside is inputted. The first contactors 22$p$ and 22$n$ are closed or opened corresponding to a command signal from the control device 5. For example, the first contactors 22$p$ and 22$n$ are closed corresponding to the command signal from the control device 5 to connect the first battery ESE and the first voltage converter 31 in a case of performing the charge and discharge of the first battery ESE during the traveling of the vehicle V. A precharge resistor 23$r$ and a first precharge contactor 23$p$ are connected to the first contactor 22$p$ on the positive pole side in parallel with the first contactor 22$p$ in order to alleviate an inrush current to a smoothing condenser included in the electric power conversion circuit 3. That is, the first precharge contactor 23$p$ and the first contactor 22$n$ on the negative pole side are closed when the first battery ESE and the first voltage converter 31 are connected; and the first precharge contactor 23$p$ is opened and the first contactor 22$p$ on the positive pole side is closed after the precharge of the smoothing condenser is completed.

Further, a first sensor unit 24 is provided in the first battery ESE for estimating an internal state of the first battery ESE. The first sensor unit 24 is configured by a plurality of sensors which detect physical quantities necessary for obtaining a charge state of the first battery ESE in the control device 5 and transmit a signal corresponding to the detected values to the control device 5. More specifically, the first sensor unit 24 is configured by a voltage sensor for detecting a voltage of the first battery ESE, a current sensor for detecting a current of the first battery ESE, a temperature sensor for detecting a temperature of the first battery ESE, etc.

The vehicle auxiliary equipment 4 includes a plurality of auxiliary devices (such as a battery heater, an air conditioner inverter, a DC-DC converter, etc.) and an auxiliary battery (such as a lead storage battery) serving as a power supply for driving the auxiliary devices. The vehicle auxiliary equipment 4 is connected between the first contactors 22$p$ and 22$n$ and the first voltage converter 31 within the first power lines 21$p$ and 21$n$. Therefore, the electric power necessary for driving the vehicle auxiliary equipment 4 is mainly supplied from the first battery ESE. It is also possible to supply the electric power generated by the generator G to the vehicle auxiliary equipment 4 via the electric power conversion circuit 3. A power meter 41 is provided in the vehicle auxiliary equipment 4 for detecting the electric power consumed by each of the auxiliary devices and transmitting a signal corresponding to the detected values to the control device 5.

The second battery ESP is a secondary battery capable of both a discharge for converting chemical energy into electric energy and a charge for converting electric energy into chemical energy. The following describes a case of using a so-called lithium ion storage battery that performs a charge and a discharge by moving lithium ions between electrodes as the second battery ESP, but the disclosure is not limited thereto.

Further, a battery having charge and discharge characteristics different from those of the first battery ESE is used as the second battery ESP. More specifically, the second battery ESP has an output weight density higher than that of the first battery ESE and an energy weight density lower than that of the first battery ESE. That is, the first battery ESE is superior to the second battery ESP in terms of the energy weight density, and the second battery ESP is superior to the first battery ESE in terms of the output weight density. The energy weight density is the electric power amount per unit weight [Wh/kg], and the output weight density is the electric power per unit weight [W/kg]. Therefore, the first battery ESE having a good energy weight density is an electric storage device of a capacitive type mainly for a large capacity, and the second battery ESP having a good output weight density is an electric storage device of an output type mainly for a large output.

Positive and negative poles of the second battery ESP are connected to a second voltage converter 32 (to be described below) in the electric power conversion circuit 3 via second power lines 25$p$ and 25$n$, respectively. Second contactors 26$p$ and 26$n$ are respectively provided in the second power lines 25$p$ and 25$n$ for connecting or disconnecting the second battery ESP and the second voltage converter 32.

The second contactors 26$p$ and 26$n$ are of a normally open type, which are opened to disconnect the connection between the second battery ESP and the second voltage converter 32 in a state where no command signal from the outside is inputted. The second contactors 26$p$ and 26$n$ are closed or opened corresponding to the command signal from the control device 5. For example, the second contactors 26$p$ and 26$n$ are closed corresponding to the command signal from the control device 5 to connect the second battery ESP and the second voltage converter 32 in a case of performing the charge and discharge of the second battery ESP during the traveling of the vehicle V. A precharge resistor 27$r$ and a second precharge contactor 2'7$p$ are connected to the second contactor 26$p$ on the positive pole side in parallel with the second contactor 26$p$ in order to alleviate an inrush current to the smoothing condenser included in the electric power conversion circuit 3. That is, the second precharge contactor 2'7$p$ and the second contactor 26$n$ on the negative pole side are closed when the second battery ESP and the second voltage converter 32 are connected; and the second precharge contactor 2'7$p$ is opened and the second contactor 26$p$ on the positive pole side is closed after the precharge of the smoothing condenser is completed.

Further, a second sensor unit 28 is provided in the second battery ESP for estimating an internal state of the second battery ESP. The second sensor unit 28 is configured by a plurality of sensors which detect physical quantities necessary for obtaining a charge state of the second battery ESP in the control device 5 and transmit a signal corresponding to the detected values to the control device 5. More specifically, the second sensor unit 28 is configured by a voltage sensor for detecting a voltage of the second battery ESP, a current sensor for detecting a current of the second battery ESP, a temperature sensor for detecting a temperature of the second battery ESP, etc.

The electric power conversion circuit 3 includes the first voltage converter 31 connected to the first battery ESE (hereinafter abbreviated as the "first VCU 31"), the second voltage converter 32 connected to the second battery ESP (hereinafter abbreviated as the "second VCU 32"), a first inverter 33 connected to the motor generator M, a second inverter 34 connected to the generator G, first bus lines 35$p$ and 35$n$ which are power lines connecting the first VCU 31 and the first inverter 33, second bus lines 36$p$ and 36$n$ which are power lines connecting the second VCU 32 and the second inverter 34, and connection lines 3'7$p$ and 37$n$ which are power lines connecting the first bus lines 35$p$ and 35$n$ and the second bus lines 36$p$ and 36$n$.

The first VCU 31 is, for example, a bidirectional DC-DC converter including a plurality of switching elements (such as IGBTs) driven by a gate drive signal generated by a gate drive circuit 6 of the control device 5. The first VCU 31 operates under the gate drive signal from the gate drive circuit 6, boosts and supplies to the first bus lines 35$p$ and 35$n$ a DC voltage supplied from the first battery ESE via the first power lines 21$p$ and 21$n$, and prompts the discharge of the first battery ESE, and during the charge of the first battery ESE, steps down and supplies to the first power lines 21$p$ and 21$n$ a DC voltage supplied from the first inverter 33, the second inverter 34, or the second VCU 32 via the first bus lines 35$p$ and 35$n$ and prompts the charge of the first battery ESE.

The second VCU 32 is, for example, a bidirectional DC-DC converter including a plurality of switching elements (such as IGBTs) driven by the gate drive signal generated by the gate drive circuit 6 of the control device 5. The second VCU 32 operates under the gate drive signal from the gate drive circuit 6, boosts and supplies to the second bus lines 36$p$ and 36$n$ a DC voltage supplied from the second battery ESP via the second power lines 25$p$ and 25$n$, and prompts the discharge of the second battery ESP; and steps down and supplies to the second power lines 25$p$ and 25$n$ a DC voltage supplied from the first inverter 33, the second inverter 34, or the first VCU 31 via the second bus lines 36$p$ and 36$n$ and prompts the charge of the second battery ESP.

The first inverter 33 is, for example, a PWM inverter by means of pulse width modulation and with a bridge circuit configured by bridge-connecting a plurality of switching elements (such as IGBTs) driven by the gate drive signal generated by the gate drive circuit 6 of the control device 5. A DC input/output side of the first inverter 33 is connected to the first VCU 31, the second VCU 32, and a DC output side of the second inverter 34 via the power lines 35$p$, 35$n$, 3'7$p$, 37$n$, 36$p$ and 36$n$. An AC input/output side of the first inverter 33 is connected to each coil of a U phase, a V phase, and a W phase of the motor generator M. During the powering operation of the motor generator M, the first inverter 33 operates under the gate drive signal from the gate drive circuit 6, converts a DC applied from the first bus lines 35$p$ and 35$n$ to the DC input/output side into an AC and supplies the AC to the motor generator M to generate a driving force. During the regenerative operation of the motor generator M, the first inverter 33 operates under the gate drive signal from the gate drive circuit 6, converts an AC applied from the motor generator M to the AC input/output side into a DC and supplies the DC to the first bus lines 35$p$ and 35$n$.

The second inverter 34 is, for example, a PWM inverter by means of pulse width modulation and with a bridge circuit configured by bridge-connecting a plurality of switching elements (such as IGBTs) driven by the gate drive signal generated by the gate drive circuit 6 of the control device 5. The DC output side of the second inverter 34 is connected to the first VCU 31, the second VCU 32, and the DC input/output side of the first inverter 33 via the power lines 35p, 35n, 37p, 37n, 36p and 36n. An AC input side of the second inverter 34 is connected to each coil of a U phase, a V phase, and a W phase of the generator G. During the electric power generation of the generator G using the power generated by the engine E, the second inverter 34 operates under the gate drive signal from the gate drive circuit 6, operates under a control signal from the gate drive circuit 6, converts an AC applied from the generator G to the AC input side into a DC and supplies the DC to the second bus lines 36p and 36n.

The control device 5 includes the gate drive circuit 6, which drives the plurality of switching elements provided in the electric power conversion circuit 3, and the ECU 7, which is an electronic control module for executing a charge and discharge control of the first battery ESE and the second battery ESP by using the gate drive circuit 6 and the engine E.

Figure 2:
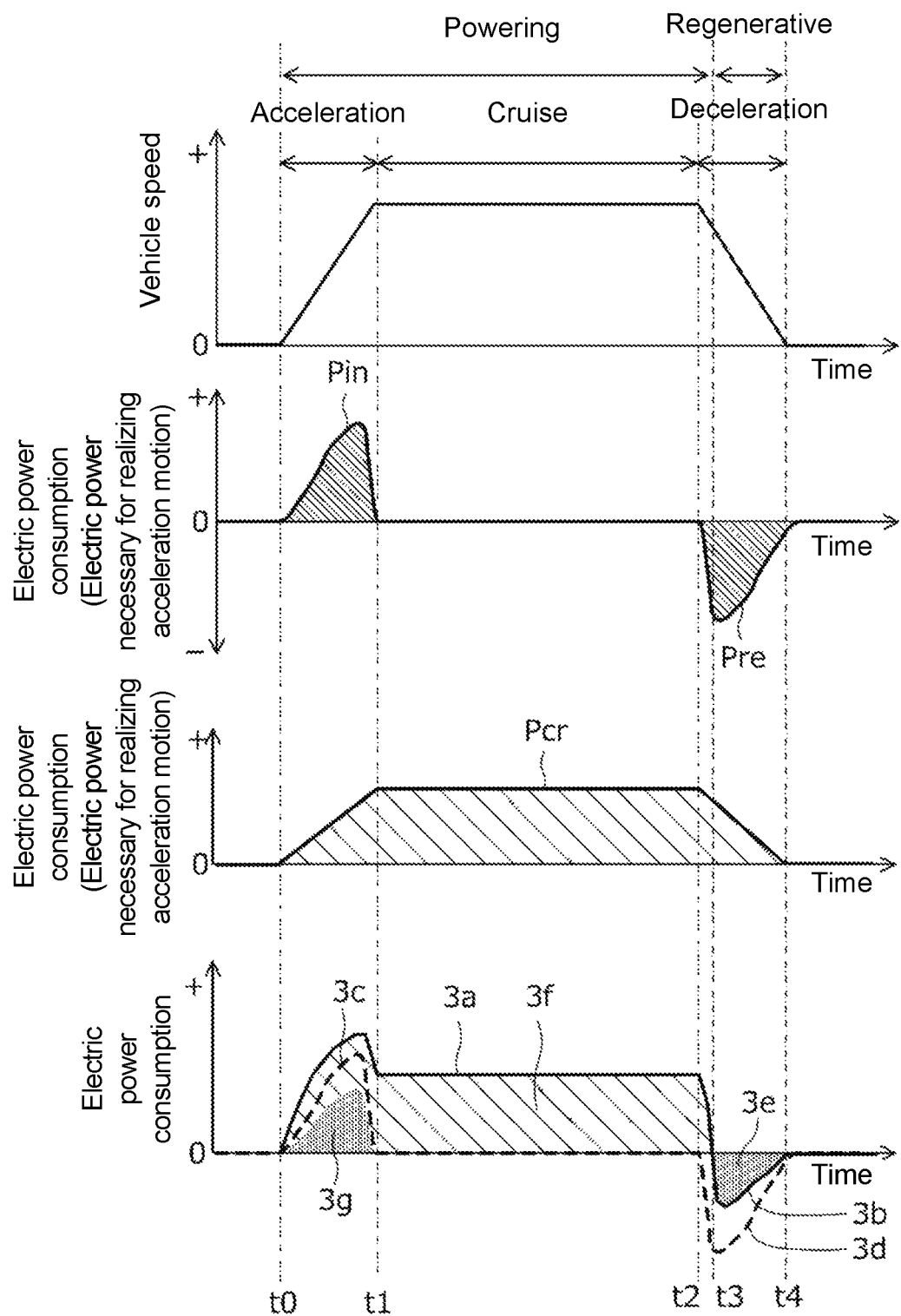
FIG. 2 is a diagram for illustrating a concept of a charge and discharge control by an ECU.

FIG. 2 is a diagram for illustrating a concept of the charge and discharge control executed by the ECU. FIG. 2 shows a temporal change of the vehicle speed in a certain traveling cycle and a temporal change of the electric power consumption of the vehicle V under this temporal change of the vehicle speed. In FIG. 2, the positive side is defined as the electric power consumption side, and the negative side is defined as the electric power generation side. Further, in the present embodiment, a period when the vehicle V starts traveling from a stationary state (i.e. a state where the vehicle speed is 0) until the vehicle V becomes stationary again after the traveling is defined as one traveling cycle (i.e. the period from the time t0 to the time t4 in the example of FIG. 2). In addition, for ease of understanding, among the electric power consumption of the vehicle V, illustration of the share consumed by the vehicle auxiliary equipment 4 and the share generated by the generator G is omitted in FIG. 2. Further, in FIG. 2, the uppermost row shows the temporal change of the vehicle speed, the second and third rows from the top show breakdowns of the electric power consumption, and the lowermost row shows requested electric power obtained by summing these breakdowns. Here, the requested electric power is the electric power requested by discharging or for charging the two batteries ESE and ESP installed in the vehicle V.

For example, during the acceleration in the period from the time t0 to the time t1, in order to make the motor generator M to perform the powering operation to accelerate the vehicle V from the stationary state to a predetermined cruise speed, in the vehicle V, the electric power necessary for changing the vehicle speed of the vehicle V to the cruise speed under a predetermined acceleration (hereinafter also referred to as the "electric power necessary for realizing the acceleration motion") as shown in the second row from the top in FIG. 2 and the electric power necessary for realizing a constant speed motion of the vehicle V under the action of travel resistance (hereinafter also referred to as the "electric power necessary for realizing the constant speed motion under the action of the travel resistance") as shown in the third row from the top in FIG. 2 have to be supplied to the motor generator M. Here, the electric power necessary for realizing the acceleration motion during the powering operation refers more specifically to the electric power necessary for realizing the acceleration motion of the vehicle V in a state of ignoring the existence of the travel resistance which can act on the vehicle V during the traveling, i.e. the electric power necessary for realizing the acceleration motion of a mass point having the same mass as the vehicle weight of the vehicle V under the non-action of the travel resistance.

Further, during the cruise in the period from the time t1 to the time t2, in order to make the motor generator M to perform the powering operation to make the vehicle V keep traveling at the cruise speed, in the vehicle V, the electric power necessary for realizing the constant speed motion of the vehicle V under the action of the travel resistance has to be supplied to the motor generator M (please refer to the third row from the top in FIG. 2). In addition, since the vehicle speed does not change in the period from the time t1 to the time t2, as shown in the second row from the top in FIG. 2, the electric power necessary for realizing the acceleration motion is 0.

Further, during the deceleration in the period from the time t2 to the time t4, the motor generator M performs the regenerative operation to decelerate the vehicle V from the cruise speed until it becomes stationary, and the electric power is generated by realizing the deceleration motion by the motor generator M. In the period from the time t2 to the time t4, the electric power necessary for realizing the acceleration motion is negative as shown in the second row from the top in FIG. 2. In other words, in the period from the times t2 to t4, positive electric power can be recovered by realizing the deceleration motion by the motor generator M. Here, the electric power that can be recovered by realizing the deceleration motion by the motor generator M is electric power converted from kinetic energy of the mass point having the same mass as the vehicle weight of the vehicle V under the non-action of the travel resistance and is equal to the electric power necessary for realizing the acceleration motion in the period from the time t0 to the time t1 with a reversed sign if the loss due to the electric power conversion in the electric power conversion circuit 3 is 0. Further, the travel resistance also acts on the vehicle V during the deceleration, and since the travel resistance decreases as the vehicle speed decreases, in the period from the time t2 to the time t4, the electric power necessary for realizing the constant speed motion under the action of the travel resistance gradually decreases. Therefore, the requested electric power, which is the sum of the electric power generated by realizing the deceleration motion and the electric power necessary for realizing the constant speed motion under the action of the travel resistance, starts decreasing from the time t2 when the deceleration starts and later turns from positive to negative at the time t3. That is, there is a short time lag (t2 to t3) from the time when the requested electric power that has been positive at the starting of the deceleration until the time it turns to negative later. Therefore, during the deceleration, the batteries can be charged with the electric power generated by the motor generator M only in the period from the time t3 to the time t4, as shown in the lowermost row in FIG. 2.

In one traveling cycle from the times t0 to t4 as described above, the electric power consumed by the vehicle V (i.e. the sum of the electric power necessary for realizing the acceleration motion and the electric power necessary for realizing the constant speed motion under the action of the travel resistance) changes as indicated by the bold line 3a in the lowermost row of FIG. 2, and the electric power generated by the vehicle V (i.e. the electric power generated by realizing the deceleration motion by the motor generator M) changes as indicated by the bold line 3b in the lowermost row of FIG. 2. Further, in one traveling cycle, the electric power necessary for realizing the acceleration motion of the vehicle V in the period from the times t0 to t1 changes as indicated by the bold dotted line 3c in the lowermost row in FIG. 2, and the electric power that can be recovered by realizing the deceleration motion by the motor generator M in the period from the times t2 to t4 changes as indicated by the bold dotted 3d in the lowermost row of FIG. 2.

Here, the vehicle weight during the acceleration and the deceleration substantially has no change. For this reason, as shown by the bold dotted lines 3c and 3d in FIG. 2, if various losses are not considered, the amount of the electric power necessary for realizing the acceleration motion (i.e. the area cut out by the bold dotted line 3c) is equal to the amount of the electric power that can be recovered by realizing the deceleration motion (i.e. the area cut out by the bold dotted line 3d). Further, since the vehicle V necessarily turns to deceleration after acceleration, a section where the electric power necessary for realizing the acceleration motion occurs and a section where the electric power that can be recovered by realizing the deceleration motion occurs appear in pairs in any traveling cycle. However, since there are losses due to the travel resistance and losses in the electric power conversion circuit 3, etc., the amount of the electric power that can be actually recovered by the batteries during the deceleration (i.e. the area of the region 3e) is always less than the amount of the electric power that can be recovered by realizing the deceleration motion (i.e. the area cut out by the bold dotted line 3d). In the charge and discharge control according to the present embodiment, the charge and discharge of the first battery ESE and the second battery ESP are controlled by focusing on the balance of the electric power in one traveling cycle as described above.

As described above, the first battery ESE has the energy weight density better than that of the second battery ESP and is an electric storage device of the capacitive type mainly for a large capacity, and the second battery ESP has the output weight density better than that of the first battery ESE and is an electric storage device of the output type mainly for a large output. Therefore, during the powering operation (times t0 to t3 in the example of FIG. 2) in which the electric power is supplied from the batteries to the motor generator M for traveling, at least a part of the electric power necessary for realizing the acceleration motion (the part indicated by the region 3g in the example of FIG. 2) among the requested electric power (the part cut out by the bold line 3a and the parts indicated by the region 3f and the region 3g in the example of FIG. 2), which is the electric power requested by discharging all the electric storage devices including the first battery ESE and the second battery ESP, is borne by the second battery ESP, which is the output type, and the remaining electric power obtained by subtracting the burden share of the second battery ESP from the requested electric power (the part obtained by subtracting the region 3g from the region 3f in the example of FIG. 2), is borne by the first battery ESE, which is the capacitive type. Further, during the regenerative operation in which the vehicle travels while charging the batteries with the electric power generated by the motor generator M, the electric power generated by the motor generator M (the part indicated by the region 3e in the example of FIG. 2) is all charged to the second battery ESP and not charged to the first battery ESE. As described above, if various losses are considered, the area of the region 3e is less than the area of the region cut out by the bold dotted line 3c. For this reason, not all but at least a part of the electric power necessary for realizing the acceleration motion is borne by the second battery ESP, by which the balance of the electric power of the second battery ESP during one traveling cycle can be made close to 0. In this way, the charge state of the second battery ESP can be spontaneously maintained within a predetermined target range. In addition, by maintaining the charge state of the second battery ESP within the target range as described above, the necessary electric power can be promptly supplied from the second battery ESP according to the acceleration request from the driver during the powering operation, and the electric power generated by the motor generator M can be received by the second battery ESP during the regenerative operation.

Figure 3:
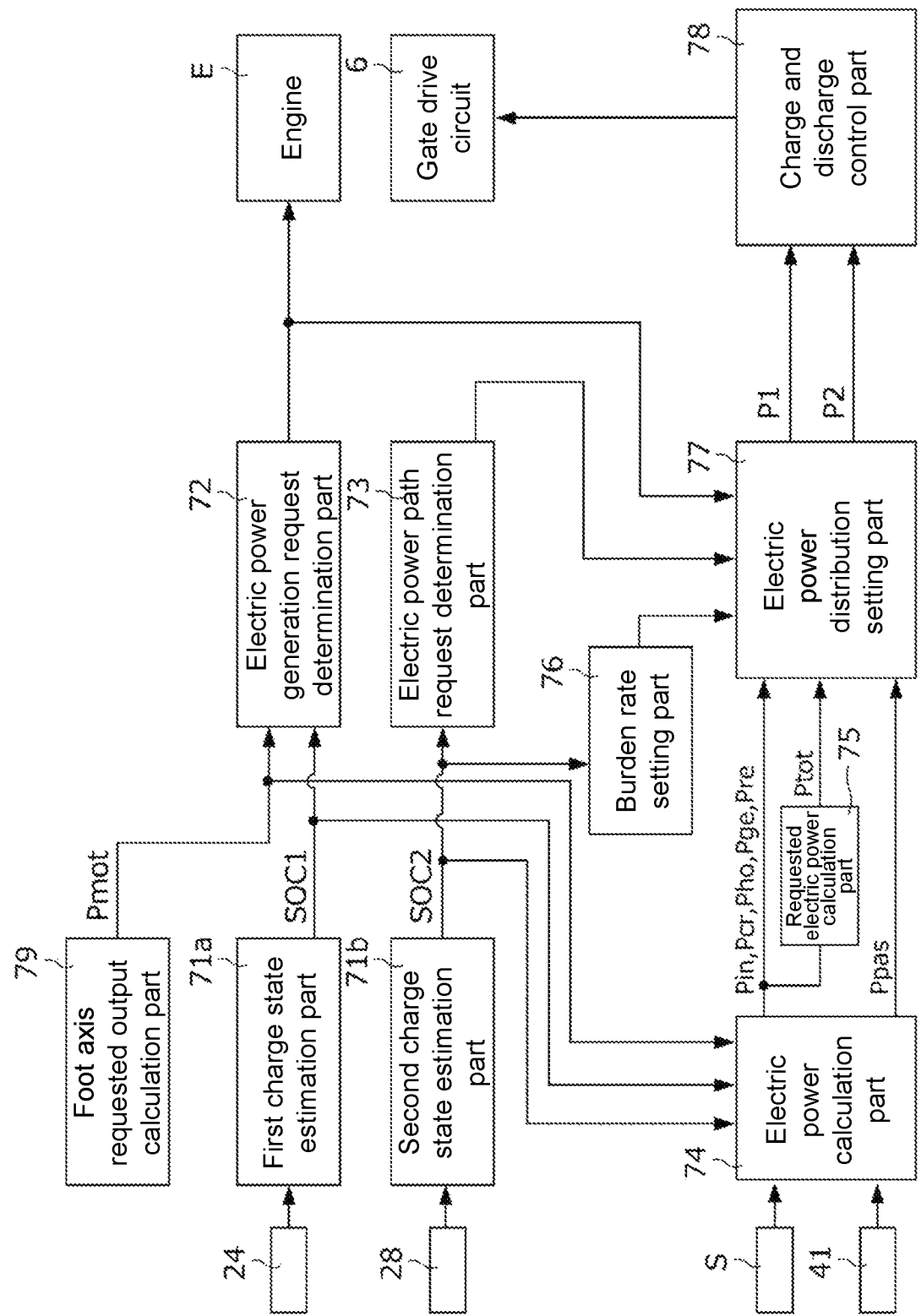
FIG. 3 is a functional block diagram for realizing the charge and discharge control in the ECU.

FIG. 3 is a functional block diagram for realizing the above-described charge and discharge control in the ECU.

The ECU 7 includes a first charge state estimation part 71a, a second charge state estimation part 71b, an electric power generation request determination part 72, an electric power path request determination part 73, an electric power calculation part 74, a burden rate setting part 76, an electric power distribution setting part 77, a charge and discharge control part 78, and a foot axis requested output calculation part 79.

The first charge state estimation part 71a estimates the charge state of the first battery ESE with a detection signal transmitted from the first sensor unit 24. More specifically, the first charge state estimation part 71a estimates a charge rate [%] which is a parameter correlated with the charge state of the first battery ESE. The charge rate expresses the ratio of the remaining amount of the battery to the battery capacity as a percentage. The first charge state estimation part 71a obtains the values of the current, voltage, and temperature of the first battery ESE with the detection signal of the first sensor unit 24 and calculates an estimated value of the charge rate of the first battery ESE (hereinafter referred to as the "SOC1") based on known algorithms using these values.

The second charge state estimation part 71b estimates the charge state of the second battery ESP with a detection signal transmitted from the second sensor unit 28. More specifically, like the first charge state estimation part 71a, the second charge state estimation part 71b obtains the values of the current, voltage, and temperature of the second battery ESP with the detection signal of the second sensor unit 28 and calculates an estimated value of the charge rate of the second battery ESP (hereinafter referred to as the "SOC2"), which is a parameter correlated with the charge state of the second battery ESP, based on known algorithms using these values.

Based on a detected value of an accelerator opening degree sensor that detects an opening degree of an accelerator pedal operated by the driver, the foot axis requested output calculation part 79 calculates a foot axis requested output Pmot which is the electric power requested by the motor generator M and is a positive value.

By using the estimated value SOC1 calculated by the first charge state estimation part 71a and the foot axis requested output Pmot calculated by the foot axis requested output calculation part 79, the electric power generation request determination part 72 determines whether it is a state where the electric power generation by the generator G is requested. As described above with reference to FIG. 2, in the vehicle V, the electric power generated by the motor generator M during the regenerative operation is charged to the second battery ESP and not charged to the first battery ESE. Therefore, the electric power generation request determination part 72 determines whether the electric power generation by the generator G is necessary based on the estimated value SOC1 correlated with the charge state of the first battery ESE. More specifically, the electric power generation request determination part 72 determines that the electric power generation by the generator G is requested in a case where the estimated value SOC1 is less than a predetermined threshold value and the charge of the first battery ESE is requested, or in a case where the foot axis requested output Pmot is greater than a predetermined threshold value and assistance of the electric power by the generator G is requested; and the electric power generation request determination part 72 determines that the electric power generation by the generator G is not requested in cases other than the above cases.

More specifically, the electric power generation request determination part 72 determines that the electric power generation by the generator G is unnecessary and stops the engine E in a case where the estimated value SOC1 is greater than a predetermined electric power generation start threshold value. Further, the electric power generation request determination part 72 determines that the electric power generation by the generator G is necessary, starts the engine E, and makes the generator G to generate electric power by using the power generated by the engine E in a case where the estimated value SOC1 is less than or equal to the electric power generation start threshold value. Further, as to be described later with reference to FIGS. 6, 7, etc., the electric power generated by the generator G according to this request is used for charging the first battery ESE or for reducing the burden of the first battery ESE so that the charge rate of the first battery ESE is maintained substantially at a predetermined target.

By using the estimated value SOC2 calculated by the second charge state estimation part 71b, the electric power path request determination part 73 determines whether it is a state where the execution of an electric power path for supplying a part of the electric power of the first battery ESE to the second battery ESP to charge the second battery ESP is requested. As described above with reference to FIG. 2, in the vehicle V, the electric power generated by the motor generator M during the regenerative operation is charged to the second battery ESP, by which the balance of the electric power of the second battery ESP is maintained substantially at 0. Therefore, since the charge state of the second battery ESP is spontaneously maintained within the predetermined target range, the execution of the electric power path is basically unnecessary. However, for some reason, the charge rate of the second battery ESP may fall outside below the predetermined target range in some cases.

Therefore, the electric power path request determination part 73 determines that the execution of the electric power path is unnecessary in a case where the estimated value SOC2 is greater than a predetermined lower limit threshold value. Further, the electric power path request determination part 73 requests the execution of the electric power path in a case where the estimated value SOC2 is less than or equal to the lower limit threshold value. As to be described later with reference to FIGS. 6, 7, etc., electric power equivalent to path electric power Ppas calculated by the electric power calculation part 74 is discharged from the first battery ESE to charge the second battery ESP in a case where the execution of the electric power path is requested.

The electric power calculation part 74 calculates various types of electric power that are consumed or generated in the vehicle V based on signals transmitted from the speedometer S and the electric power meter 41, etc. The electric power calculation part 74 calculates inertial electric power Pin [W], which is the electric power necessary for realizing the acceleration motion; regenerative electric power Pre [W], which is the electric power that can be recovered by the motor generator M by realizing the deceleration motion by the motor generator M; auxiliary equipment electric power Pho [W], which is the electric power necessary for driving the vehicle auxiliary equipment 4; cruise electric power Per [W], which is the electric power necessary for realizing the constant speed motion under the action of the travel resistance; generated electric power Pge [W], which is the electric power generated by the generator G using the power of the engine E; and, in a case where the execution of the electric power path is requested by the electric power path request determination part 73, the path electric power Ppas [W], which is the electric power that needs to be discharged from the first battery ESE and needs to be charged to the second battery ESP.

Figure 4:
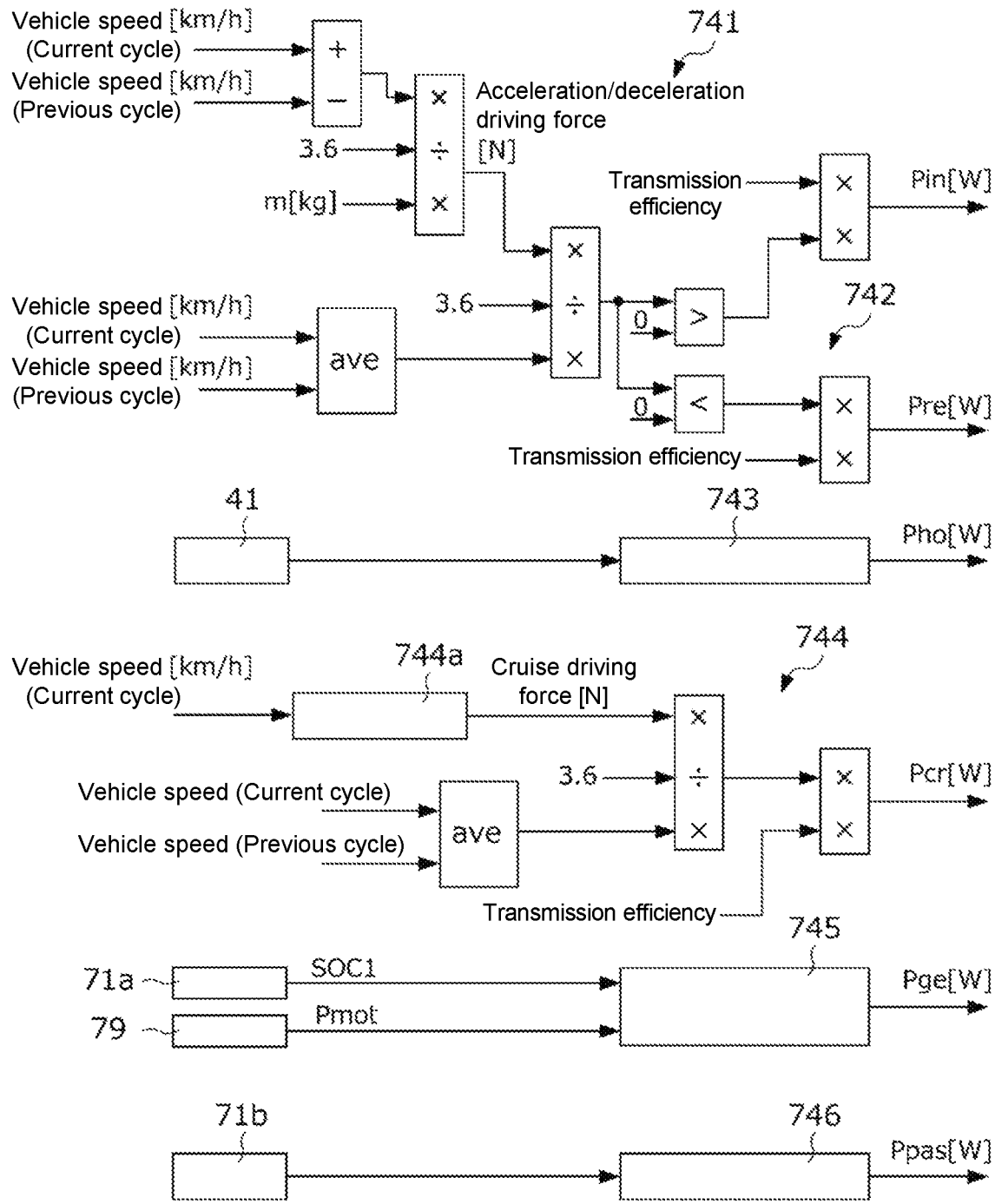
FIG. 4 is a functional block diagram showing a calculation procedure in an electric power calculation part.

FIG. 4 is a functional block diagram showing a calculation procedure in the electric power calculation part 74. The electric power calculation part 74 includes an inertial electric power calculation part 741 for calculating the inertial electric power Pin, a regenerative electric power calculation part 742 for calculating the regenerative electric power Pre, an auxiliary equipment electric power calculation part 743 for calculating the auxiliary equipment electric power Pho, a cruise electric power calculation part 744 for calculating the cruise electric power Per, a generated electric power calculation part 745 for calculating the generated electric power Pge, and a path electric power calculation part 746 for calculating the path electric power Ppas.

The inertial electric power calculation part 741 calculates the inertial electric power Pin, which is the electric power necessary for changing the speed of the mass point the same as the vehicle weight m [kg] of the vehicle V under the non-action of the travel resistance. More specifically, the inertial electric power calculation part 741 calculates a speed difference [km/h], which is the difference between the vehicle speed [km/h] in the current control cycle and the vehicle speed [km/h] in the previous control cycle, with the detection signal of the speedometer S; and calculates an acceleration/deceleration driving force [N] by multiplying the speed difference by the reciprocal of a coefficient (such as 3.6) for converting the speed unit from [km/h] to [m/s] and by a predetermined vehicle weight m [kg]. Further, the inertial electric power calculation part 741 calculates an average speed [km/h], which is the average of the vehicle speed in the current control cycle and the vehicle speed in the previous control cycle, with the detection signal of the speedometer S; and calculates an acceleration/deceleration energy [W] by multiplying the average speed by the acceleration/deceleration driving force [N] and by the reciprocal of a coefficient (such as 3.6) for converting the speed unit from [km/h] to [m/s]. The acceleration/deceleration energy calculated as described above is positive during the acceleration, is negative during the deceleration, and is 0 during the cruise. The inertial electric power calculation part 741 calculates the inertial electric power Pin by multiplying the greater one of the acceleration/deceleration energy calculated as described above and the value 0 by a predetermined transmission efficiency. Here, the value of the transmission efficiency is set between 0 and 1, with losses occurring in the process of converting the electric energy inputted by the motor generator M into the kinetic energy of the vehicle V during the powering operation (such as the loss in the motor generator M, the loss occurring in the drive system, etc.) taken into consideration. The inertial electric power Pin calculated as described above is a value greater than 0 during the acceleration and is 0 during the deceleration or the cruise, as shown in FIG. 2.

The regenerative electric power calculation part 742 calculates the regenerative electric power Pre by diverting the calculation in the inertial electric power calculation part 741. More specifically, the regenerative electric power calculation part 742 calculates the regenerative electric power Pre by multiplying the smaller one of the acceleration/deceleration energy calculated by the inertial electric power calculation part 741 and the value 0 by a predetermined transmission efficiency and by a coefficient (−1) for inverting the sign. Here, the value of the transmission efficiency is set between 0 and 1, with losses occurring in the process of converting the kinetic energy of the vehicle body into the electric energy by the motor generator M (such as the loss in the motor generator M, the loss occurring in the drive system, the loss caused by the brake operation by the driver, etc.) taken into consideration. The regenerative electric power Pre calculated as described above is a value greater than 0 during the deceleration and is 0 during the acceleration or the cruise, as shown in FIG. 2.

The auxiliary equipment electric power calculation part 743 calculates the auxiliary equipment electric power Pho with the detection signal of the electric power meter 41 provided in the vehicle auxiliary equipment 4. The auxiliary equipment electric power Pho calculated as described above is a positive value greater than or equal to 0.

The cruise electric power calculation part 744 calculates the cruise electric power Pcr, which is the electric power necessary for realizing the constant speed motion of the vehicle V under the action of the travel resistance. More specifically, the cruise electric power calculation part 744 first calculates in a cruise driving force calculation part 744a a cruise driving force [N] equivalent to the travel resistance force acting on the vehicle V during the traveling based on the detection signal of the speedometer S. The cruise driving force calculation part 744a calculates the vehicle speed in the current control cycle with the detection signal of the speedometer S and calculates the cruise driving force by inputting the calculated vehicle speed to a predetermined calculation formula. This calculation formula uses a second degree of the vehicle speed, for example. Further, in this calculation formula, values of a coefficient a of a constant term, a coefficient b of a term proportional to the first degree of the vehicle speed, and a coefficient c of a term proportional to the second degree of the vehicle speed are appropriately set according to the temperature, atmospheric conditions, etc. Further, the cruise electric power calculation part 744 calculates the average speed, which is the average of the vehicle speed in the current control cycle and the vehicle speed in the previous control cycle, with the detection signal of the speedometer S and calculates the cruise electric power Pcr by multiplying the average speed by the cruise driving force, by the reciprocal of a coefficient (such as 3.6) for converting the speed unit from [km/h] to [m/s], and by the predetermined transmission efficiency. Here, the value of the transmission efficiency is set between 0 and 1, with losses occurring in the process of converting the electric energy inputted by the motor generator M into the kinetic energy of the vehicle V during the powering operation (such as the loss in the motor generator M, the loss occurring in the drive system, etc.) taken into consideration. The cruise electric power Pcr calculated as described above is a positive value greater than or equal to 0 in a case where the vehicle speed is not 0, as shown in FIG. 2.

The generated electric power calculation part 745 calculates the generated electric power Pge (which is a negative value) so as to reduce the burden of the first battery ESE with the foot axis requested output Pmot and the estimated value SOC1 of the charge rate of the first battery ESE in a case where the electric power generation by the generator G is requested by the electric power generation request determination part 72. More specifically, the generated electric power calculation part 745 calculates the generated electric power Pge by multiplying the value "−1" by the sum of the regenerative requested electric power (a positive value) of the first battery ESE, which is calculated based on the estimated value SOC1, and the foot axis requested output Pmot (a positive value) in a case where the estimated value SOC1 is less than the predetermined threshold value and the charge of the first battery ESE is requested. Further, the generated electric power calculation part 745 calculates the generated electric power Pge by multiplying the value "−1" by a positive value obtained by subtracting the assistance share (a positive value) of the first battery ESE, which is calculated based on the estimated value SOC1, from the foot axis requested output Pmot in a case where the foot axis requested output Pmot is greater than the predetermined threshold value and the assistance by the generator G is requested. Further, the generated electric power calculation part 745 sets the generated electric power Pge to 0 in a case where the electric power generation by the generator G is not requested by the electric power generation request determination part 72. The generated electric power Pge calculated as described above is a negative value less than or equal to 0.

The path electric power calculation part 746 sets the path electric power Ppas to 0 in a case where the execution of the electric power path is not requested by the electric power path request determination part 73 and calculates the path electric power Ppas based on the estimated value SOC2 calculated by the second charge state estimation part 71b in a case where the execution of the electric power path is requested. The path electric power Ppas calculated as described above is a positive value greater than or equal to 0.

With reference back to FIG. 3, the requested electric power calculation part 75 calculates the requested electric power with the results obtained by the electric power calculation part 74. Here, the requested electric power is positive during the powering operation of the motor generator M and is equivalent to the electric power requested by discharging all the batteries including the first battery ESE and the second battery ESP, and the requested electric power is negative during the regenerative operation of the motor generator M and is equivalent to the electric power requested for charging all the batteries. As shown in the following formula (1), the requested electric power calculation part 75 calculates the requested electric power Ptot by summing the inertial electric power Pin, the regenerative electric power Pre, the auxiliary equipment electric power Pho, the cruise electric power Pcr, and the generated electric power Pge, which are calculated by the electric power calculation part 74.

$$Ptot=Pin+Pre+Pho+Pcr+Pge \qquad (1)$$

The burden rate setting part 76 sets a burden rate equivalent to the ratio of the burden share of the second battery ESP among the inertial electric power Pin calculated by the electric power calculation part 74. As described with reference to FIG. 2, since a considerable loss occurs during the regenerative operation, if all of the inertial electric power Pin is borne by the second battery ESP, the balance of the electric power of the second battery ESP becomes minus, and the charge rate of the second battery ESP may fall outside below the predetermined target range. Therefore, in order to prevent the charge rate of the second battery ESP from decreasing, the burden rate setting part 76 sets the value of the burden rate k between 0 and 1 based on the estimated value SOC2 calculated by the second charge state estimation part 71b.

Figure 5:
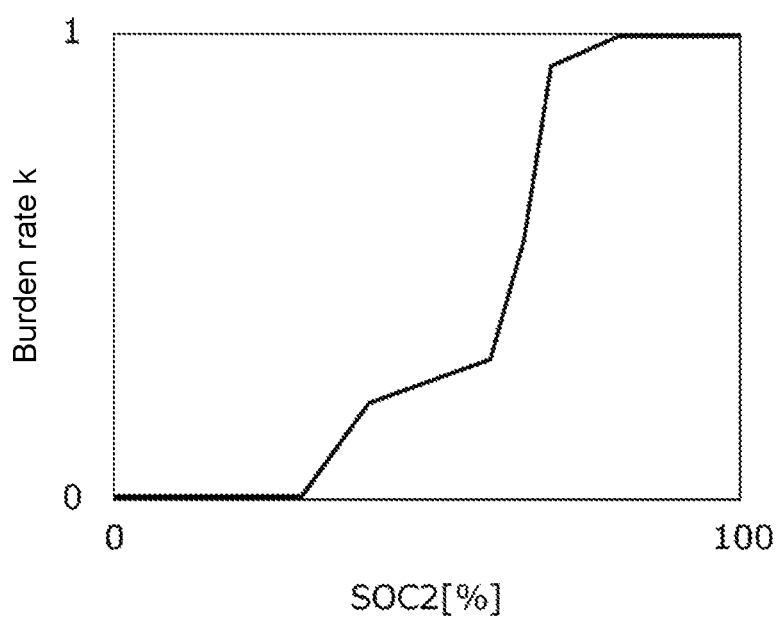
FIG. 5 is an example of a map for setting a value of a burden rate.

The burden rate setting part 76 sets the value of the burden rate k, for example, by searching a map as shown in FIG. 5 based on the estimated value SOC2. According to the map as exemplified in FIG. 5, the value of the burden rate k is set to a greater value as the estimated value SOC2 increases. That is, the burden rate setting part 76 sets the burden rate k to a greater value as the estimated value SOC2 increases (i.e. the charge rate of the second battery ESP increases, and the margin for accepting new electric power decreases) to prompt the aggressive discharge of the second battery ESP. Further, the burden rate setting part 76 sets the burden rate k to a smaller value as the estimated value SOC2 decreases (i.e. the charge rate of the second battery ESP decreases, and the margin allowing for new discharge decreases) to prompt the aggressive charge of the second battery ESP.

The electric power distribution setting part 77 sets the distribution mode of the electric power of the first battery ESE and the second battery ESP by using the estimated values of various types of electric power calculated by the electric power calculation part 74, the burden rate set by the burden rate setting part 76, the determination result of the electric power generation request determination part 72, and the determination result of the electric power path request determination part 73.

Figure 6:
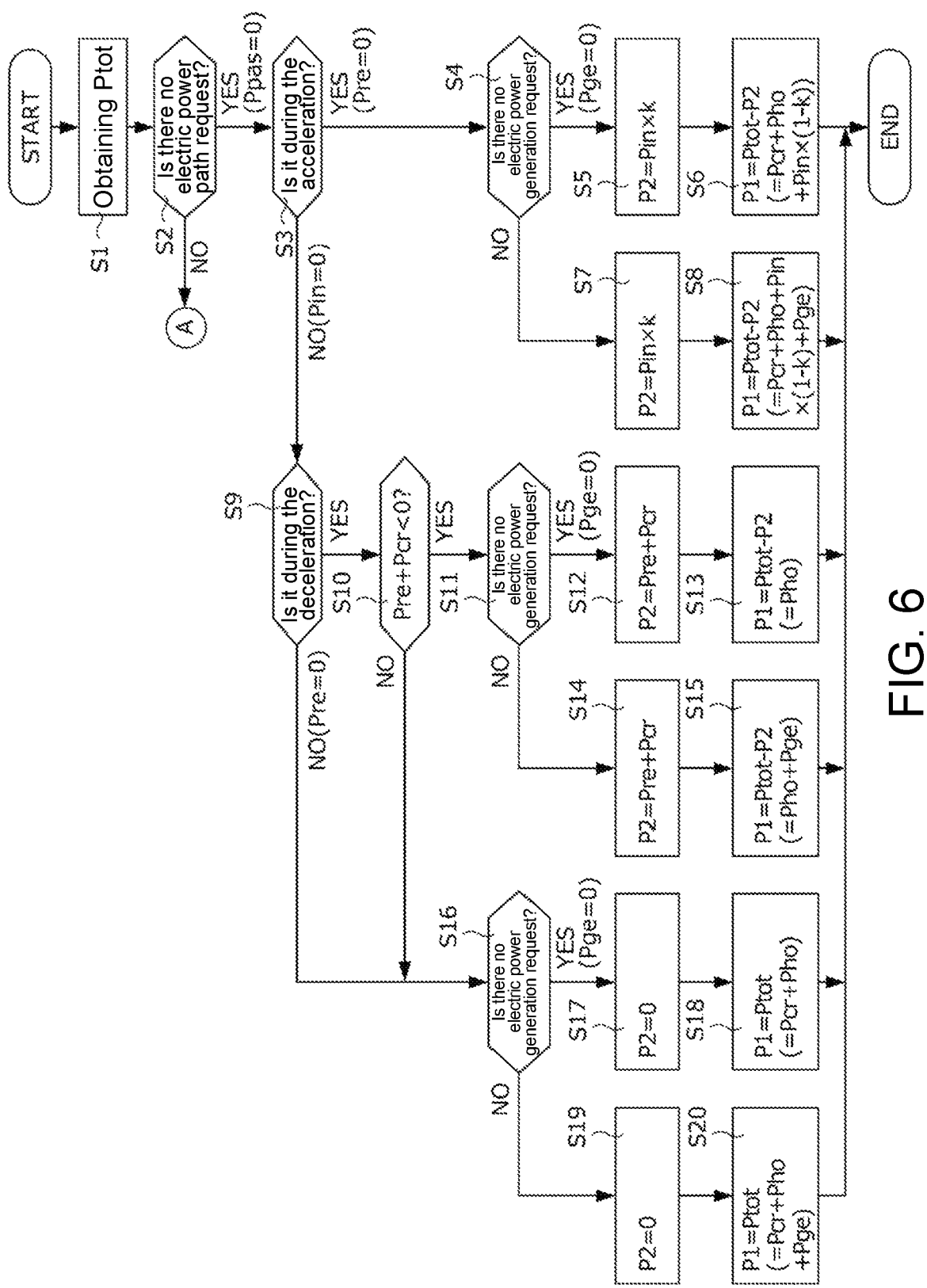
FIG. 6 is a flowchart (part 1) showing a specific procedure for setting an electric power distribution mode.
Figure 7:
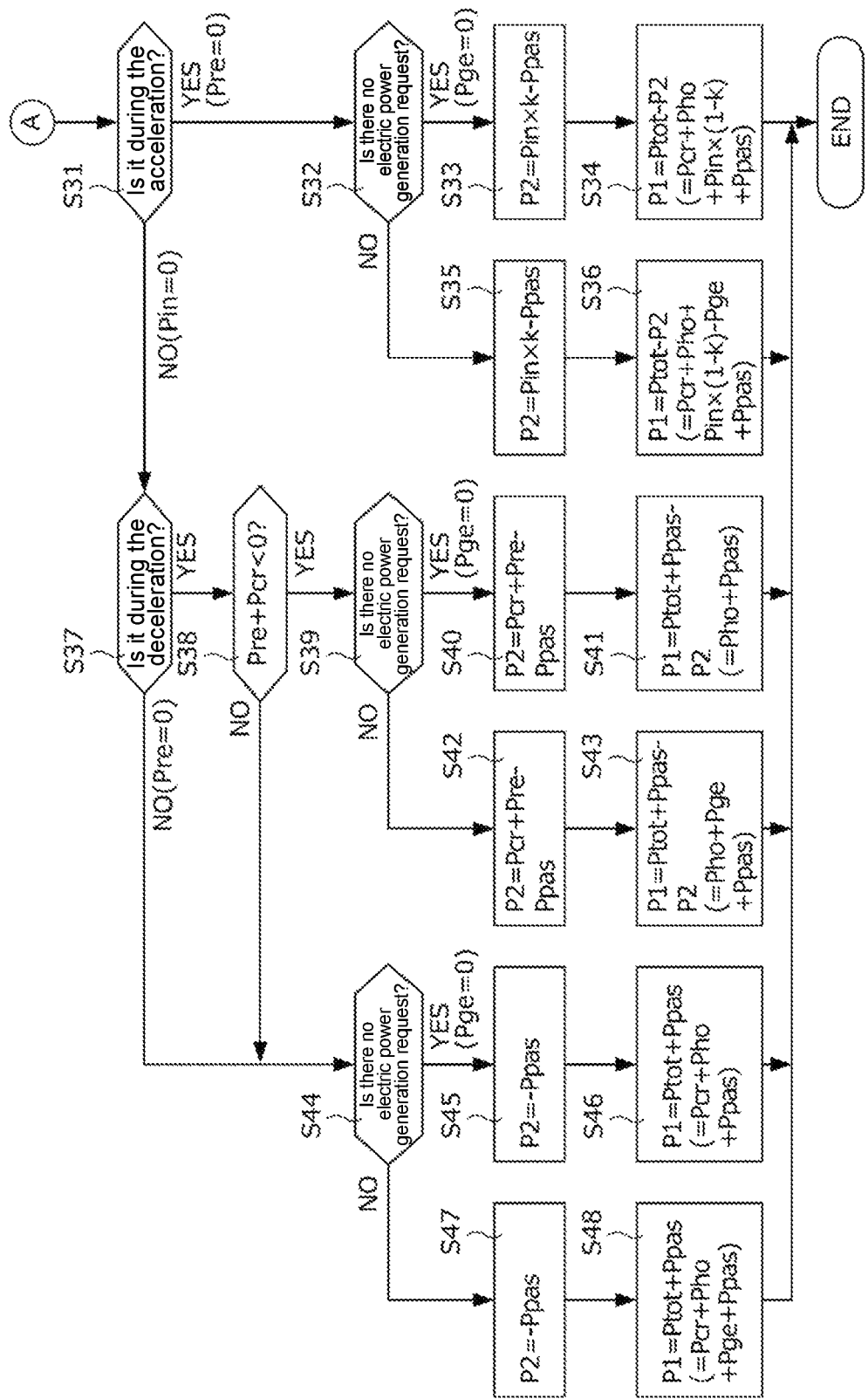
FIG. 7 is a flowchart (part 2) showing a specific procedure for setting an electric power distribution mode.

FIGS. 6 and 7 are flowcharts showing a specific procedure for setting an electric power distribution mode by the electric power distribution setting part 77. The process of FIGS. 6 and 7 is repeatedly executed under a predetermined control cycle in the electric power distribution setting part 77 while the vehicle V is running.

In S1, the electric power distribution setting part 77 obtains the requested electric power Ptot calculated by the requested electric power calculation part 75 and proceeds to S2.

In S2, the electric power distribution setting part 77 determines whether an electric power path request is not given by the electric power path request determination part 73. The electric power distribution setting part 77 proceeds to S3 in a case where the determination result of S2 is YES (that is, in a case where there is no electric power path request, i.e. where Ppas=0) and proceeds to S31 in a case where the determination result of S2 is NO (that is, in a case where there is an electric power path request, i.e. where Ppas≠0).

In S3, the electric power distribution setting part 77 determines whether the vehicle V is accelerating based on the detection signal of the speedometer S. The electric power distribution setting part 77 proceeds to S4 in a case where the determination result of S3 is YES (that is, in a case where the regenerative electric power Pre=0) and proceeds to S9 in a case where the determination result of S3 is NO (that is, in a case where the inertial electric power Pin=0).

In S4, the electric power distribution setting part 77 determines whether an electric power generation request is not given by the electric power generation request determination part 72. The electric power distribution setting part 77 proceeds to S5 in a case where the determination result of S4 is YES (that is, in a case where there is no electric power generation request, i.e. where the generated electric power Pge=0) and proceeds to S7 in a case where the determination result of S4 is NO (that is, in a case where there is an electric power generation request, i.e. where the generated electric power Pge≠0).

In S5, the electric power distribution setting part 77 sets electric power obtained by multiplying the inertial electric power Pin, which is calculated by the electric power calculation part 74, by the burden rate k, which is set by the burden rate setting part 76, as burden electric power P2 of the second battery ESP (that is, the electric power to be discharged from the second battery ESP to the motor generator M) and proceeds to S6.

In S6, the electric power distribution setting part 77 sets electric power obtained by summing the cruise electric power Pcr, the auxiliary equipment electric power Pho, and electric power obtained by multiplying the inertial electric power Pin by (1−burden rate k), wherein the cruise electric power Pcr, the auxiliary equipment electric power Pho, and the inertial electric power Pin are calculated by the electric power calculation part 74, as burden electric power P1 of the first battery ESE (that is, the electric power to be discharged from the first battery ESE to the motor generator M and the vehicle auxiliary equipment 4) and ends this process.

Figure 8A:
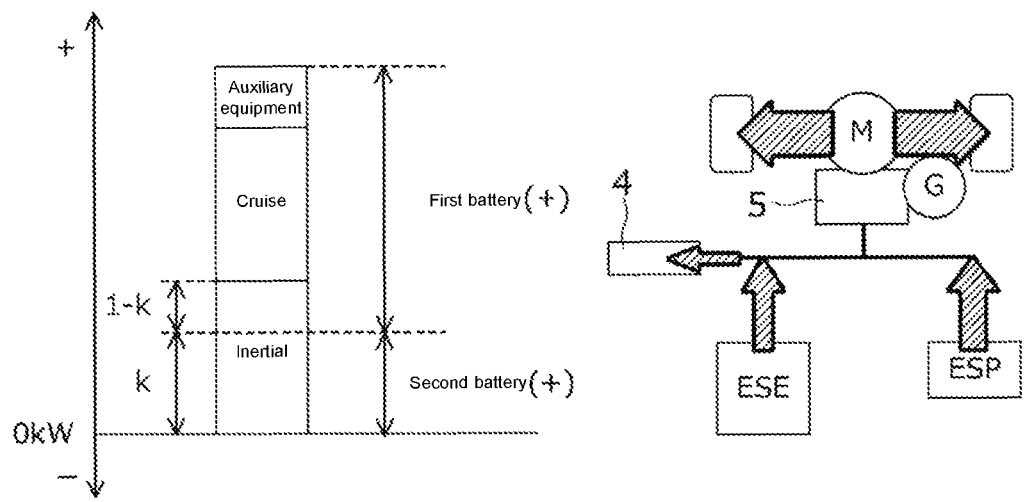
FIG. 8A is a diagram schematically showing an electric power distribution mode in a case where there is no electric power path request, it is during the acceleration, and there is no electric power generation request.

FIG. 8A is a diagram schematically showing an electric power distribution mode in a case where there is no electric power path request, it is during the acceleration, and there is no electric power generation request (that is, in a case where S5 and S6 are executed). In this case, the electric power (Pin×k) obtained by multiplying the inertial electric power Pin by the burden rate k is discharged from the second battery ESP and supplied to the motor generator M. Further, the electric power (Pcr+Pho+Pin×(1−k)), which is the sum of the cruise electric power Pcr, the auxiliary equipment electric power Pho, and the remainder obtained by subtracting the burden share of the second battery ESP from the inertial electric power Pin (that is, the remaining electric power obtained by subtracting the electric power (Pin×k), which is discharged from the second battery ESP, from the requested electric power (Ptot=Pcr+Pin+Pho) with respect to all the electric storage devices during the powering operation), is discharged from the first battery ESE and supplied to the vehicle auxiliary equipment 4 and the motor generator M.

In S7, the electric power distribution setting part 77 sets the electric power obtained by multiplying the inertial electric power Pin, which is calculated by the electric power calculation part 74, by the burden rate k, which is set by the burden rate setting part 76, as the burden electric power P2 of the second battery ESP and proceeds to S8. In the following description, a case where the burden electric power is positive means that electric power is discharged from the batteries, and a case where the burden electric power is negative means that electric power is charged to the batteries.

In S8, the electric power distribution setting part 77 sets electric power obtained by summing the cruise electric power Pcr, the auxiliary equipment electric power Pho, the generated electric power Pge, and the electric power obtained by multiplying the inertial electric power Pin by (1−burden rate k), wherein the cruise electric power Pcr, the auxiliary equipment electric power Pho, the generated electric power Pge, and the inertial electric power Pin are calculated by the electric power calculation part 74, as the burden electric power P1 of the first battery ESE and ends this process.

Figure 8B:
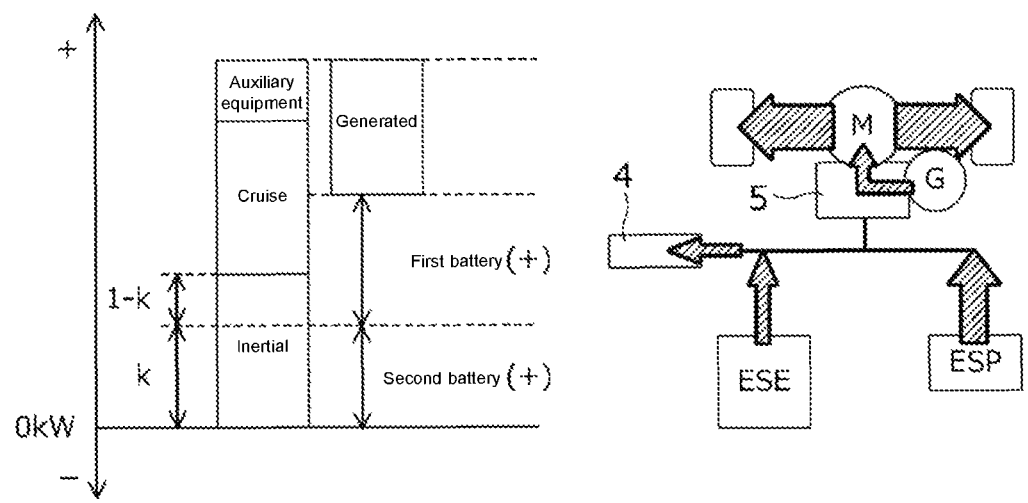
FIG. 8B is a diagram schematically showing an electric power distribution mode in a case where there is no electric power path request, it is during the acceleration, and there is an electric power generation request.

FIG. 8B is a diagram schematically showing an electric power distribution mode in a case where there is no electric power path request, it is during the acceleration, and there is an electric power generation request (that is, in a case where S7 and S8 are executed). In this case, the electric power (Pin×k) obtained by multiplying the inertial electric power Pin by the burden rate k is discharged from the second battery ESP and supplied to the motor generator M, as in a case where there is no electric power generation request (that is, the case of FIG. 8A). Further, the generated electric power Pge, which is the electric power generated by the generator G, is supplied to the motor generator M. Further, the electric power (Pcr+Pho+Pge+Pin×(1−k)), which is the sum of the cruise electric power Pcr, the auxiliary equipment electric power Pho, the generated electric power Pge, and the remainder obtained by subtracting the burden share of the second battery ESP from the inertial electric power Pin, is discharged from the first battery ESE and supplied to the vehicle auxiliary equipment 4 and the motor generator M. That is, the remaining electric power obtained by subtracting the electric power (Pin×k), which is discharged from the second battery ESP, from the requested electric power (Ptot=Pcr+Pin+Pho+Pge) with respect to all the electric storage devices during the powering operation is discharged from the first battery ESE and supplied to the vehicle auxiliary equipment 4 and the motor generator M. That is, as is apparent from the comparison between FIG. 8A and FIG. 8B, in a case where electric power is generated by the generator G, the burden electric power of the first battery ESE is reduced by that amount.

In S9, the electric power distribution setting part 77 determines whether the vehicle V is decelerating based on the detection signal of the speedometer S. The electric power distribution setting part 77 proceeds to S10 in a case where the determination result of S9 is YES and proceeds to S16 in a case where the determination result of S9 is NO (that is, in a case where the regenerative electric power Pre=0).

In S10, the electric power distribution setting part 77 determines whether the sum of the regenerative electric power Pre (which is a negative value) and the cruise electric power Pcr (which is a positive value) is greater than 0. As described above with reference to FIG. 2, there is a short time lag (t2 to t3 in FIG. 2) from the time when the deceleration starts until the charge to the batteries can start. The electric power distribution setting part 77 proceeds to S11 in a case where the determination result of S10 is YES (that is, in a case that can charge the batteries) and proceeds to S16 in a case where the determination result of S10 is NO (that is, in a case that cannot charge the batteries).

In S11, the electric power distribution setting part 77 determines whether an electric power generation request is not given by the electric power generation request determination part 72. The electric power distribution setting part 77 proceeds to S12 in a case where the determination result of S11 is YES and proceeds to S14 in a case where the determination result of S11 is NO.

In S12, the electric power distribution setting part 77 sets the electric power which is obtained by summing the regenerative electric power Pre and the cruise electric power Pcr and is a negative value as the burden electric power P2 of the second battery ESP and proceeds to S13.

In S13, the electric power distribution setting part 77 sets the auxiliary equipment electric power Pho calculated by the electric power calculation part 74 as the burden electric power P1 of the first battery ESE and ends this process.

Figure 9A:
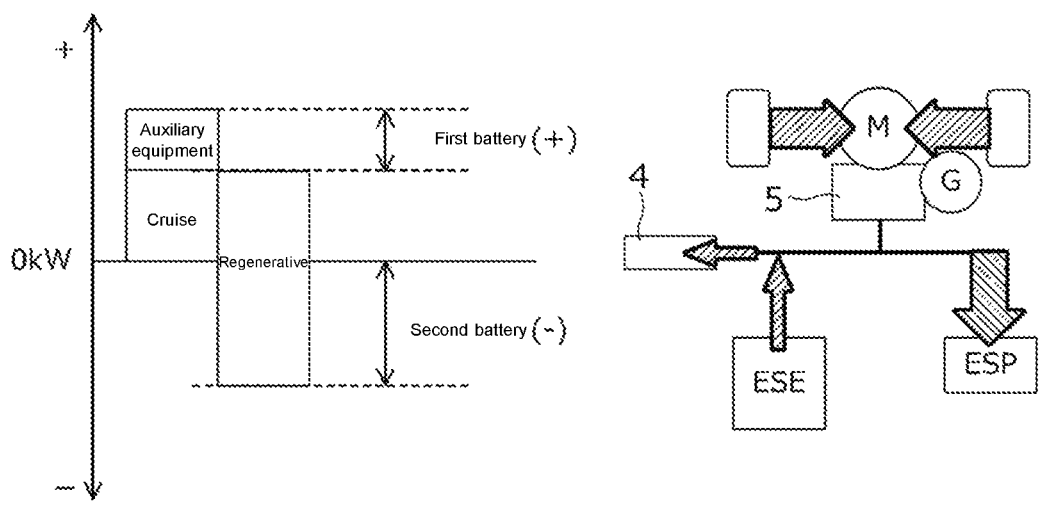
FIG. 9A is a diagram schematically showing an electric power distribution mode in a case where there is no electric power path request, it is during the deceleration, it is a state that can charge a second battery with electric power generated by a motor generator, and there is no electric power generation request.

FIG. 9A is a diagram schematically showing an electric power distribution mode in a case where there is no electric power path request, it is during the deceleration, it is a state that can charge the second battery ESP with the electric power generated by the motor generator M, and there is no electric power generation request (that is, in a case where S12 and S13 are executed). In this case, since the sum of the cruise electric power Pcr (which is a positive value) and the regenerative electric power Pre (which is a negative value) is a negative value, the burden electric power (P2=Pre+Pcr) of the second battery ESP is negative, and therefore the electric power (Pre+Pcr) from the motor generator M is charged to the second battery ESP. Further, in this case, the auxiliary equipment electric power Pho is discharged from the first battery ESE and all supplied to the vehicle auxiliary equipment 4.

In S14, the electric power distribution setting part 77 sets the electric power which is obtained by summing the regenerative electric power Pre and the cruise electric power Pcr and is a negative value as the burden electric power P2 of the second battery ESP and proceeds to S15.

In S15, the electric power distribution setting part 77 sets electric power obtained by summing the auxiliary equipment electric power Pho (which is a positive value) and the generated electric power Pge (which is a negative value), wherein the auxiliary equipment electric power Pho and the generated electric power Pge are calculated by the electric power calculation part 74, as the burden electric power P1 of the first battery ESE and ends this process.

Figure 9B:
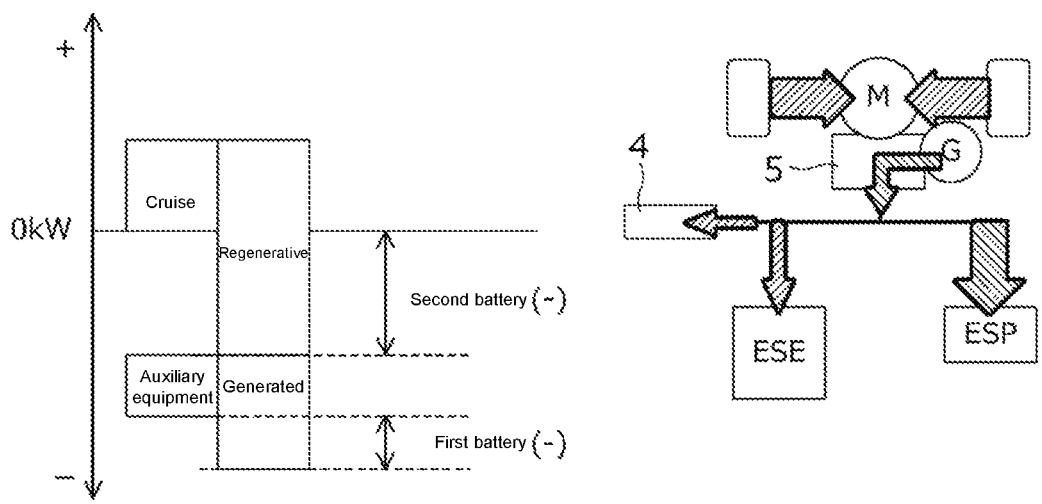
FIG. 9B is a diagram schematically showing an electric power distribution mode in a case where there is no electric power path request, it is during the deceleration, it is a state that can charge the second battery with the electric power generated by the motor generator, and there is an electric power generation request.

FIG. 9B is a diagram schematically showing an electric power distribution mode in a case where there is no electric power path request, it is during the deceleration, it is a state that can charge the second battery ESP with the electric power generated by the motor generator M, and there is an electric power generation request (that is, in a case where S14 and S15 are executed). In this case, since the sum of the cruise electric power Pcr (which is a positive value) and the regenerative electric power Pre (which is a negative value) is a negative value, the burden electric power (P2=Pre+Pcr) is charged to the second battery ESP. Further, in a case where the sum of the auxiliary equipment electric power Pho (which is a positive value) and the generated electric power Pge (which is a negative value) is positive, the burden electric power (P1=Pho+Pge), which is a positive value, is discharged from the first battery ESE; and in a case where the above-described sum is negative, the burden electric power (P1=Pho+Pge), which is a negative value, is charged to the first battery ESE.

In S16, the electric power distribution setting part 77 determines whether an electric power generation request is not given by the electric power generation request determination part 72. The electric power distribution setting part 77 proceeds to S17 in a case where the determination result of S16 is YES and proceeds to S19 in a case where the determination result of S16 is NO.

In S17, the electric power distribution setting part 77 sets the value 0 as the burden electric power P2 of the second battery ESP according to the determination that both the inertial electric power Pin and the regenerative electric power Pre are 0 and proceeds to S18.

In S18, the electric power distribution setting part 77 sets the requested electric power Ptot, which is the sum of the cruise electric power Pcr and the auxiliary equipment electric power Pho, as the burden electric power P1 of the first battery ESE and ends this process.

Figure 10A:
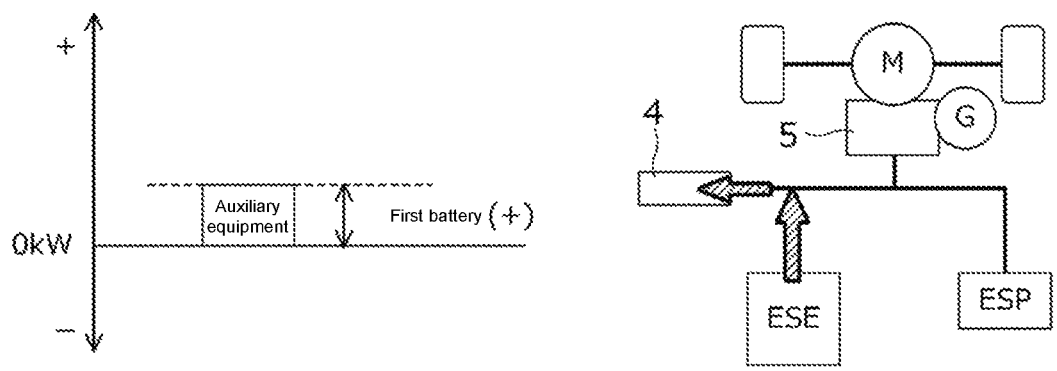
FIG. 10A is a diagram schematically showing an electric power distribution mode in a case where there is no electric power path request, it is neither during the acceleration nor during the deceleration but is during the stationary state, and there is no electric power generation request.

FIG. 10A is a diagram schematically showing an electric power distribution mode in a case where there is no electric power path request, it is neither during the acceleration nor during the deceleration but is during the stationary state, and there is no electric power generation request (that is, in a case where S17 and S18 are executed during the stationary state). Since in such a case where the vehicle V is stationary, the inertial electric power Pin, the regenerative electric power Pre, and the cruise electric power Pcr all become 0, neither charge nor discharge is performed to the second battery ESP. Further, in this case, the auxiliary equipment electric power Pho is discharged from the first battery ESE and all supplied to the vehicle auxiliary equipment 4.

Figure 10B:
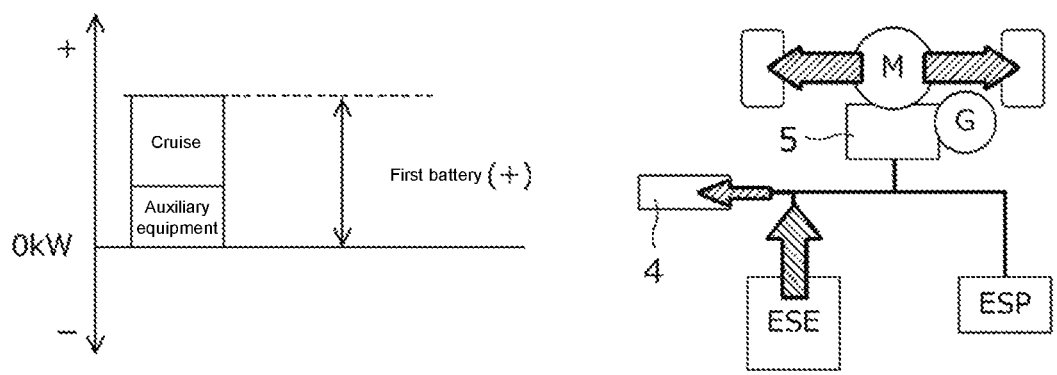
FIG. 10B is a diagram schematically showing an electric power distribution mode in a case where there is no electric power path request, it is neither during the acceleration nor during the deceleration but is during the cruise, and there is no electric power generation request.

FIG. 10B is a diagram schematically showing an electric power distribution mode in a case where there is no electric power path request, it is neither during the acceleration nor during the deceleration but is during the cruise, and there is no electric power generation request (that is, in a case where S17 and S18 are executed during the cruise). Since in such a case where the vehicle V is cruising, the inertial electric power Pin and the regenerative electric power Pre both become 0, neither charge nor discharge is performed to the second battery ESP. Further, in this case, the requested electric power Ptot, which is the sum of the auxiliary equipment electric power Pho and the cruise electric power Pcr, is discharged from the first battery ESE and supplied to the vehicle auxiliary equipment 4 and the motor generator M.

In S19, the electric power distribution setting part 77 sets the value 0 as the burden electric power P2 of the second battery ESP according to the determination that both the inertial electric power Pin and the regenerative electric power Pre are 0 and proceeds to S20.

In S20, the electric power distribution setting part 77 sets the requested electric power Ptot, which is the sum of the cruise electric power Pcr, the auxiliary equipment electric power Pho, and the generated electric power Pge (which is a negative value), as the burden electric power P1 of the first battery ESE and ends this process.

Figure 11A:
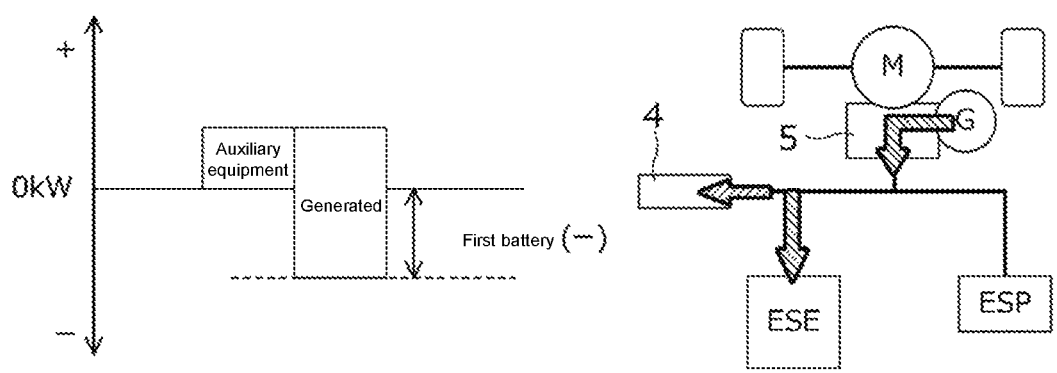
FIG. 11A is a diagram schematically showing an electric power distribution mode in a case where there is no electric power path request, it is neither during the acceleration nor during the deceleration but is during the stationary state, and there is an electric power generation request.

FIG. 11A is a diagram schematically showing an electric power distribution mode in a case where there is no electric power path request, it is neither during the acceleration nor during the deceleration but is during the stationary state, and there is an electric power generation request (that is, in a case where S19 and S20 are executed during the stationary state). Since in such a case where the vehicle V is stationary, the inertial electric power Pin, the regenerative electric power Pre, and the cruise electric power Pcr all become 0, neither charge nor discharge is performed to the second battery ESP. Further, in a case where the sum of the auxiliary equipment electric power Pho (which is a positive value) and the generated electric power Pge (which is a negative value) is positive, the burden electric power (P1=Pho+Pge), which is a positive value, is discharged from the first battery ESE; and in a case where the above-described sum is negative, the burden electric power (P1=Pho+Pge), which is a negative value, is charged to the first battery ESE.

Figure 11B:
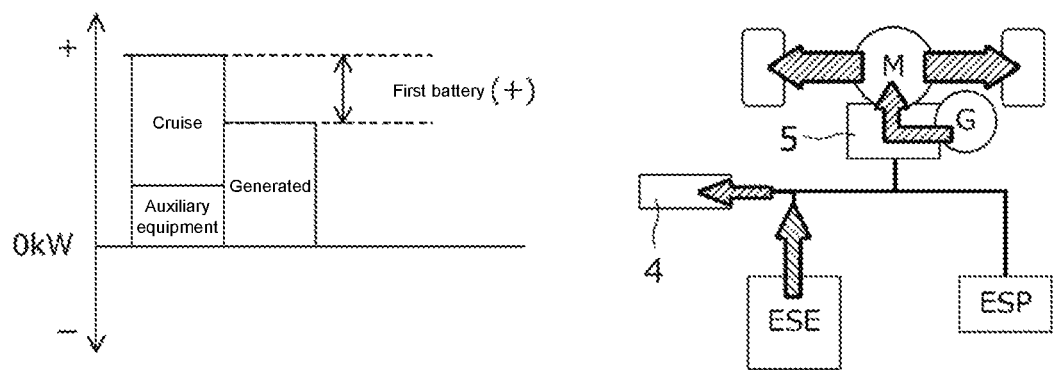
FIG. 11B is a diagram schematically showing an electric power distribution mode in a case where there is no electric power path request, it is neither during the acceleration nor during the deceleration but is during the cruise, and there is an electric power generation request.

FIG. 11B is a diagram schematically showing an electric power distribution mode in a case where there is no electric power path request, it is neither during the acceleration nor during the deceleration but is during the cruise, and there is an electric power generation request (that is, in a case where S19 and S20 are executed during the cruise). Since in such a case where the vehicle V is cruising, the inertial electric power Pin and the regenerative electric power Pre both become 0, neither charge nor discharge is performed to the second battery ESP. Further, in a case where the sum of the auxiliary equipment electric power Pho (which is a positive value), the cruise electric power Pcr (which is a positive value), and the generated electric power Pge (which is a negative value) is positive, the burden electric power (P1=Pho+Pcr+Pge), which is a positive value, is discharged from the first battery ESE; and in a case where the above-described sum is negative, the burden electric power (P1=Pho+Pcr+Pge), which is a negative value, is charged to the first battery ESE.

In S31, the electric power distribution setting part 77 determines whether the vehicle V is accelerating based on the detection signal of the speedometer S. The electric power distribution setting part 77 proceeds to S32 in a case where the determination result of S31 is YES (that is, in a case where the regenerative electric power Pre=0) and proceeds to S37 in a case where the determination result of S31 is NO (that is, in a case where the inertial electric power Pin=0).

In S32, the electric power distribution setting part 77 determines whether an electric power generation request is not given by the electric power generation request determination part 72. The electric power distribution setting part 77 proceeds to S33 in a case where the determination result of S32 is YES (that is, in a case where there is no electric power generation request, i.e. where the generated electric power Pge=0) and proceeds to S35 in a case where the determination result of S32 is NO (that is, in a case where there is an electric power generation request, i.e. where the generated electric power Pge≠0).

In S33, the electric power distribution setting part 77 sets the electric power obtained by subtracting the path electric power Ppas from the electric power obtained by multiplying the inertial electric power Pin, which is calculated by the electric power calculation part 74, by the burden rate k, which is set by the burden rate setting part 76, as the burden electric power P2 of the second battery ESP and proceeds to S34.

In S34, the electric power distribution setting part 77 sets the electric power obtained by summing the cruise electric power Pcr, the auxiliary equipment electric power Pho, the electric power obtained by multiplying the inertial electric power Pin by (1−burden rate k), and the path electric power Ppas, wherein the cruise electric power Pcr, the auxiliary equipment electric power Pho, the inertial electric power Pin, and the path electric power Ppas are calculated by the electric power calculation part 74, as the burden electric power P1 of the first battery ESE and ends this process.

Figure 12A:
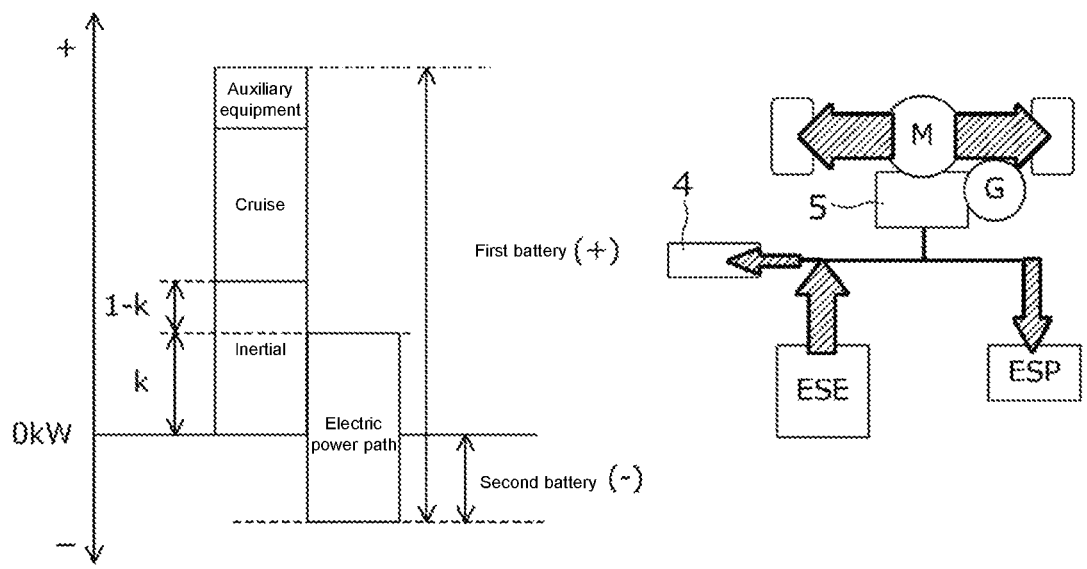
FIG. 12A is a diagram schematically showing an electric power distribution mode in a case where there is an electric power path request, it is during the acceleration, and there is no electric power generation request.

FIG. 12A is a diagram schematically showing an electric power distribution mode in a case where there is an electric power path request, it is during the acceleration, and there is no electric power generation request (that is, in a case where S33 and S34 are executed). Here, the path electric power Ppas is basically set to be greater than the electric power obtained by multiplying the inertial electric power Pin by the burden rate k. Therefore, the burden electric power (P2=Pin×k−Ppas) of the second battery ESP becomes negative. Therefore, the burden electric power (P2=Pin×k−Ppas), which is a negative value, is charged to the second battery ESP. Further, the remaining electric power (Pcr+Pho+Pin×(1−k)+Ppas) obtained by subtracting the burden electric power (P2=Pin×k−Ppas) of the second battery ESP from the requested electric power Ptot is discharged from the first battery ESE and supplied to the vehicle auxiliary equipment 4, the motor generator M, and the second battery ESP.

In S35, the electric power distribution setting part 77 sets the electric power obtained by subtracting the path electric power Ppas from the electric power obtained by multiplying the inertial electric power Pin, which is calculated by the electric power calculation part 74, by the burden rate k, which is set by the burden rate setting part 76, as the burden electric power P2 of the second battery ESP and proceeds to S36.

In S36, the electric power distribution setting part 77 sets the electric power obtained by summing the cruise electric power Pcr, the auxiliary equipment electric power Pho, the generated electric power Pge, the electric power obtained by multiplying the inertial electric power Pin by (1−burden rate k), and the path electric power Ppas, wherein the cruise electric power Pcr, the auxiliary equipment electric power Pho, the generated electric power Pge, the inertial electric power Pin, and the path electric power Ppas are calculated by the electric power calculation part 74, as the burden electric power P1 of the first battery ESE and ends this process.

Figure 12B:
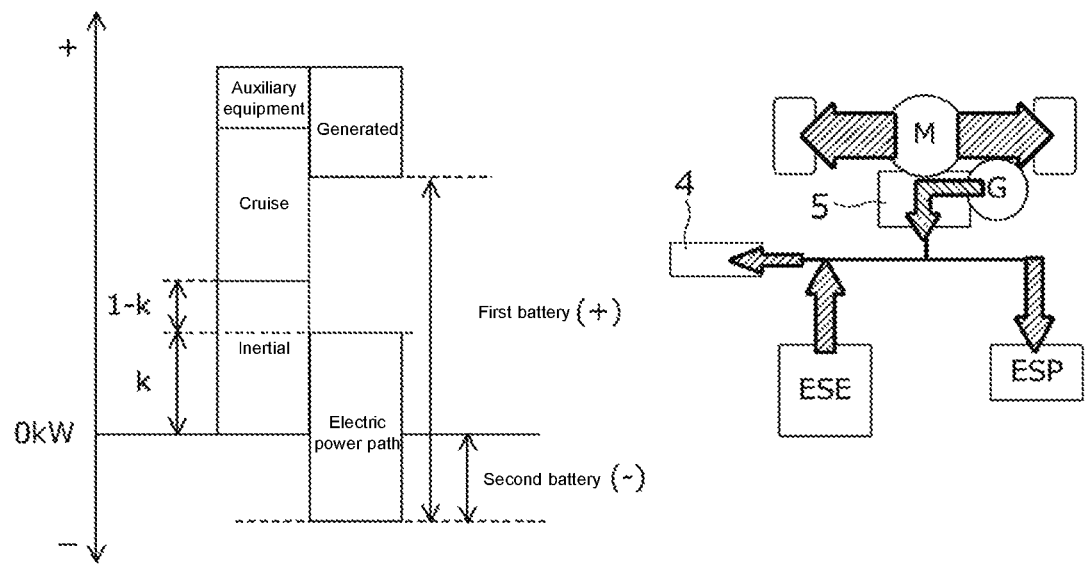
FIG. 12B is a diagram schematically showing an electric power distribution mode in a case where there is an electric power path request, it is during the acceleration, and there is an electric power generation request.

FIG. 12B is a diagram schematically showing an electric power distribution mode in a case where there is an electric power path request, it is during the acceleration, and there is an electric power generation request (that is, in a case where S35 and S36 are executed). In this case, the burden electric power (P2=Pin×k−Ppas), which is a negative value, is charged to the second battery ESP, as in a case where there is no electric power generation request (that is, the case of FIG. 12A). Further, the remaining electric power (Pcr+Pho+Pin×(1−k)+Ppas+Pge) obtained by subtracting the burden electric power (P2=Pin×k−Ppas) of the second battery ESP from the requested electric power Ptot is discharged from the first battery ESE and supplied to the vehicle auxiliary equipment 4, the motor generator M, and the second battery ESP. In addition, as is apparent from the comparison between FIG. 12A and FIG. 12B, in a case where electric power is generated by the generator G, the burden electric power of the first battery ESE is reduced by that amount.

In S37, the electric power distribution setting part 77 determines whether the vehicle V is decelerating based on the detection signal of the speedometer S. The electric power distribution setting part 77 proceeds to S38 in a case where the determination result of S37 is YES and proceeds to S44 in a case where the determination result of S37 is NO (that is, in a case where the regenerative electric power Pre=0).

In S38, the electric power distribution setting part 77 determines whether the sum of the regenerative electric power Pre (which is a negative value) and the cruise electric power Pcr (which is a positive value) is greater than 0. As described above with reference to FIG. 2, there is a short time lag (t2 to t3 in FIG. 2) from the time when the deceleration starts until the charge to the batteries can start. The electric power distribution setting part 77 proceeds to S39 in a case where the determination result of S38 is YES (that is, in a case that can charge the batteries) and proceeds to S44 in a case where the determination result of S38 is NO (that is, in a case that cannot charge the batteries).

In S39, the electric power distribution setting part 77 determines whether an electric power generation request is not given by the electric power generation request determination part 72. The electric power distribution setting part 77 proceeds to S40 in a case where the determination result of S39 is YES and proceeds to S42 in a case where the determination result of S39 is NO.

In S40, the electric power distribution setting part 77 sets the electric power obtained by subtracting the path electric power Ppas, which is a positive value, from the electric power, which is obtained by summing the regenerative electric power Pre and the cruise electric power Pcr and is a negative value, as the burden electric power P2 of the second battery ESP and proceeds to S41.

In S41, the electric power distribution setting part 77 sets the electric power (Ptot+Ppas−P2) obtained by subtracting the burden electric power P2 of the second battery ESP from the electric power obtained by summing the requested electric power Ptot and the path electric power Ppas as the burden electric power P1 of the first battery ESE and ends this process.

Figure 13A:
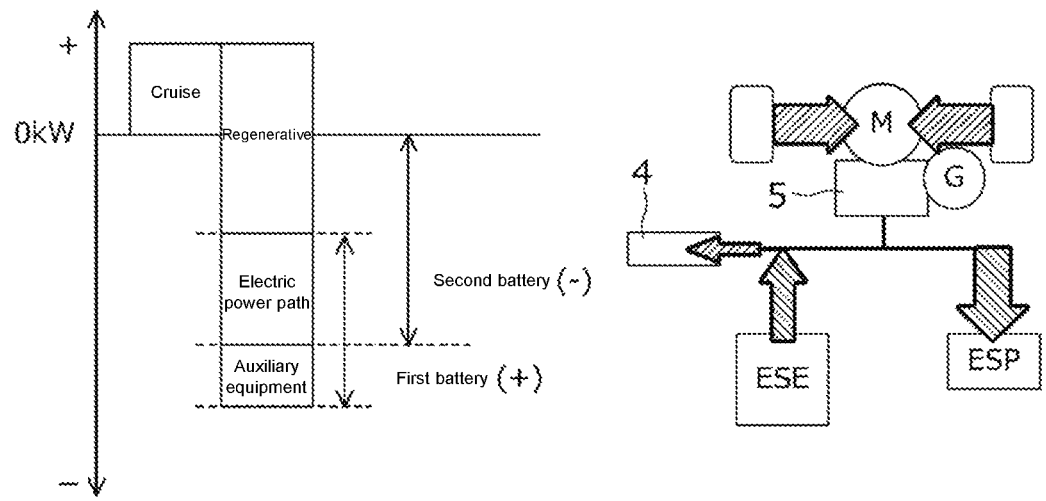
FIG. 13A is a diagram schematically showing an electric power distribution mode in a case where there is an electric power path request, it is during the deceleration, it is a state that can charge the second battery with the electric power generated by the motor generator, and there is no electric power generation request.

FIG. 13A is a diagram schematically showing an electric power distribution mode in a case where there is an electric power path request, it is during the deceleration, it is a state that can charge the second battery ESP with the electric power generated by the motor generator M, and there is no electric power generation request (that is, in a case where S40 and S41 are executed). In this case, the burden electric power (P2=Pcr+Pre−Ppas) of the second battery ESP is negative, and therefore the electric power from the first battery ESE or from the motor generator M is charged to the second battery ESP. Further, in this case, the electric power which is the sum of the auxiliary equipment electric power Pho and the path electric power Ppas is discharged from the first battery ESE and supplied to the vehicle auxiliary equipment 4 and the second battery ESP.

In S42, the electric power distribution setting part 77 sets the electric power obtained by subtracting the path electric power Ppas, which is a positive value, from the electric power, which is obtained by summing the regenerative electric power Pre and the cruise electric power Pcr and is a negative value, as the burden electric power P2 of the second battery ESP and proceeds to S43.

In S43, the electric power distribution setting part 77 sets the electric power (Ptot+Ppas−P2) obtained by subtracting the burden electric power P2 of the second battery ESP from the electric power obtained by summing the requested electric power Ptot and the path electric power Ppas as the burden electric power P1 of the first battery ESE and ends this process.

Figure 13B:
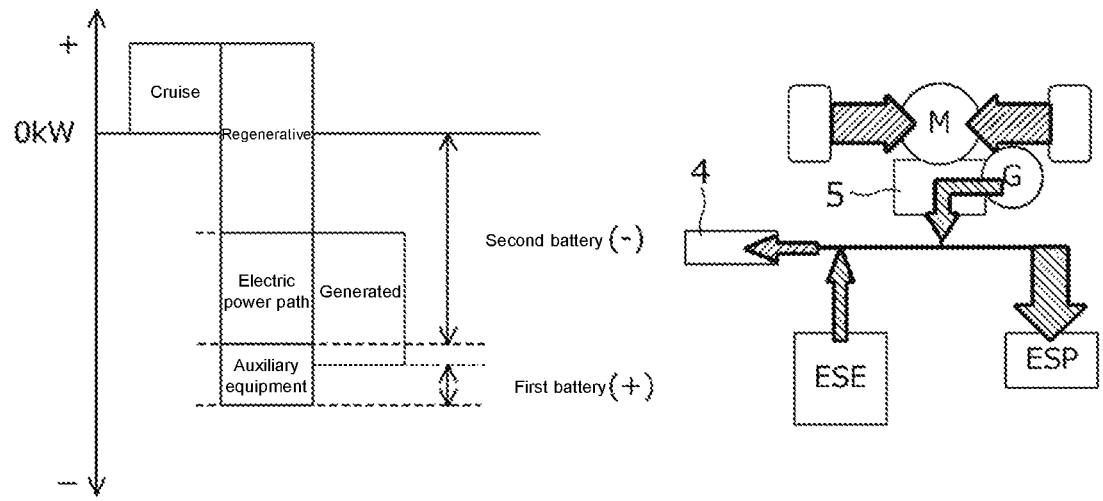
FIG. 13B is a diagram schematically showing an electric power distribution mode in a case where there is an electric power path request, it is during the deceleration, it is a state that can charge the second battery with the electric power generated by the motor generator, and there is an electric power generation request.

FIG. 13B is a diagram schematically showing an electric power distribution mode in a case where there is an electric power path request, it is during the deceleration, it is a state that can charge the second battery ESP with the electric power generated by the motor generator M, and there is an electric power generation request (that is, in a case where S42 and S43 are executed). In this case, the burden electric power (P2=Pcr+Pre−Ppas) of the second battery ESP is negative, and therefore the electric power from the first battery ESE or from the motor generator M is charged to the second battery ESP. Further, in a case where the sum of the auxiliary equipment electric power Pho (which is a positive value), the generated electric power Pge (which is a negative value), and the path electric power Ppas (which is a positive value) is positive, the burden electric power (P1=Pho+Pge+Ppas), which is a positive value, is discharged from the first battery ESE; and in a case where the above-described sum is negative, the burden electric power (P1=Pho+Pge+Ppas), which is a negative value, is charged to the first battery ESE.

In S44, the electric power distribution setting part 77 determines whether an electric power generation request is not given by the electric power generation request determination part 72. The electric power distribution setting part 77 proceeds to S45 in a case where the determination result of S44 is YES and proceeds to S47 in a case where the determination result of S44 is NO.

In S45, the electric power distribution setting part 77 sets a negative value obtained by multiplying the path electric power Ppas by the value "−1" as the burden electric power P2 of the second battery ESP and proceeds to S46.

In S46, the electric power distribution setting part 77 sets the electric power which is the sum of the requested electric power Ptot and the path electric power Ppas as the burden electric power (P1=Pcr+Pho+Ppas) of the first battery ESE and ends this process.

Figure 14A:
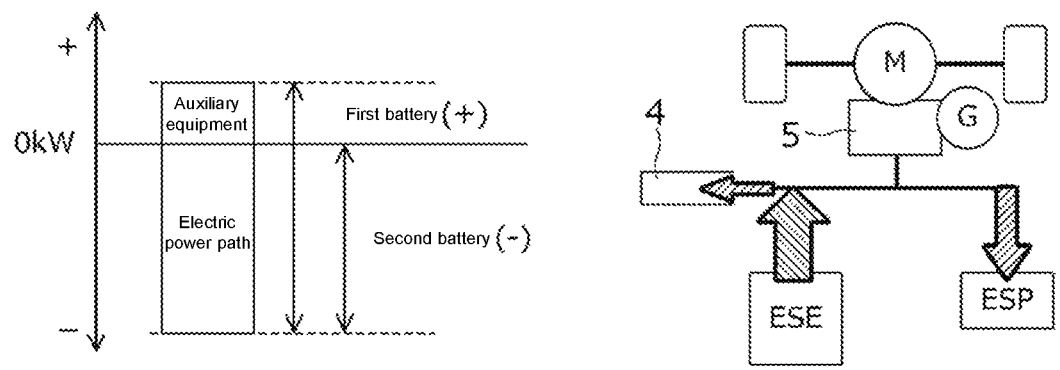
FIG. 14A is a diagram schematically showing an electric power distribution mode in a case where there is an electric power path request, it is neither during the acceleration nor during the deceleration but is during the stationary state, and there is no electric power generation request.

FIG. 14A is a diagram schematically showing an electric power distribution mode in a case where there is an electric power path request, it is neither during the acceleration nor during the deceleration but is during the stationary state, and there is no electric power generation request (that is, in a case where S45 and S46 are executed during the stationary state). Since in such a case where the vehicle V is stationary, the inertial electric power Pin, the regenerative electric power Pre, and the cruise electric power Pcr all become 0, the path electric power Ppas supplied from the first battery ESE is charged to the second battery ESP. Further, the electric power which is the sum of the auxiliary equipment electric power Pho and the path electric power Ppas is discharged from the first battery ESE and supplied to the vehicle auxiliary equipment 4 and the second battery ESP.

Figure 14B:
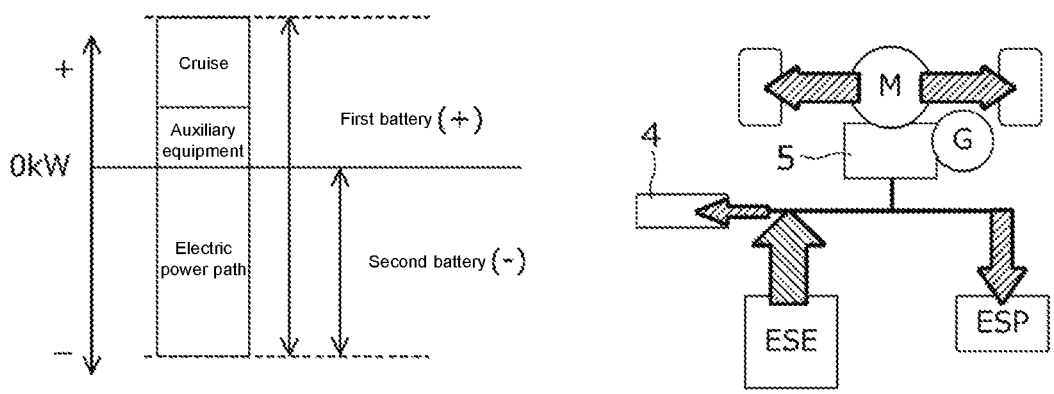
FIG. 14B is a diagram schematically showing an electric power distribution mode in a case where there is an electric power path request, it is neither during the acceleration nor during the deceleration but is during the cruise, and there is no electric power generation request.

FIG. 14B is a diagram schematically showing an electric power distribution mode in a case where there is an electric power path request, it is neither during the acceleration nor during the deceleration but is during the cruise, and there is no electric power generation request (that is, in a case where S45 and S46 are executed during the cruise). Since in such a case where the vehicle V is cruising, the inertial electric power Pin and the regenerative electric power Pre both become 0, the path electric power Ppas supplied from the first battery ESE is charged to the second battery ESP. Further, the electric power which is the sum of the cruise electric power Pcr, the auxiliary equipment electric power Pho, and the path electric power Ppas is discharged from the first battery ESE and supplied to the vehicle auxiliary equipment 4, the second battery ESP and the motor generator M.

In S47, the electric power distribution setting part 77 sets a negative value obtained by multiplying the path electric power Ppas by the value "−1" as the burden electric power P2 of the second battery ESP and proceeds to S48.

In S48, the electric power distribution setting part 77 sets the electric power which is the sum of the requested electric power Ptot and the path electric power Ppas as the burden electric power (P1=Pcr+Pho+Pge+Ppas) of the first battery ESE and ends this process.

Figure 15A:
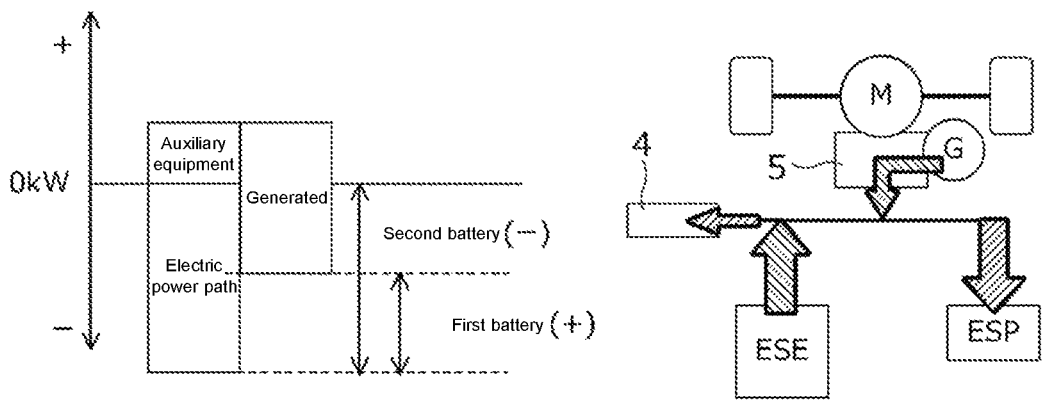
FIG. 15A is a diagram schematically showing an electric power distribution mode in a case where there is an electric power path request, it is neither during the acceleration nor during the deceleration but is during the stationary state, and there is an electric power generation request.

FIG. 15A is a diagram schematically showing an electric power distribution mode in a case where there is an electric power path request, it is neither during the acceleration nor during the deceleration but is during the stationary state, and there is an electric power generation request (that is, in a case where S47 and S48 are executed during the stationary state). Since in such a case where the vehicle V is stationary, the inertial electric power Pin, the regenerative electric power Pre, and the cruise electric power Pcr all become 0, the path electric power Ppas supplied from the first battery ESE or from the generator G is charged to the second battery ESP. Further, in a case where the sum of the auxiliary equipment electric power Pho (which is a positive value), the generated electric power Pge (which is a negative value), and the path electric power Ppas (which is a positive value) is positive, the burden electric power (P1=Pho+Pge+Ppas), which is a positive value, is discharged from the first battery ESE; and in a case where the above-described sum is negative, the burden electric power (P1=Pho+Pge+Ppas), which is a negative value, is charged to the first battery ESE.

Figure 15B:
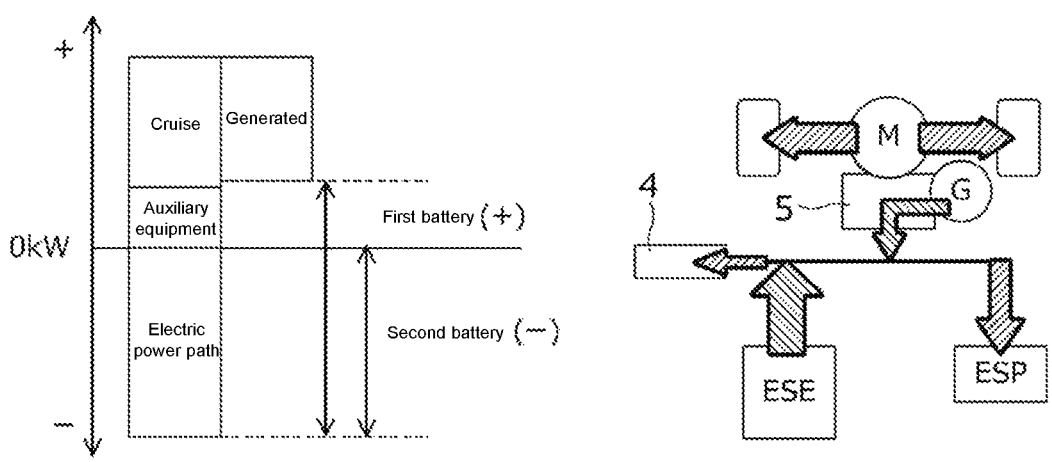
FIG. 15B is a diagram schematically showing an electric power distribution mode in a case where there is an electric power path request, it is neither during the acceleration nor during the deceleration but is during the cruise, and there is an electric power generation request.

FIG. 15B is a diagram schematically showing an electric power distribution mode in a case where there is an electric power path request, it is neither during the acceleration nor during the deceleration but is during the cruise, and there is an electric power generation request (that is, in a case where S47 and S48 are executed during the cruise). Since in such a case where the vehicle V is cruising, the inertial electric power Pin and the regenerative electric power Pre both become 0, the path electric power Ppas supplied from the first battery ESE or from the generator G is charged to the second battery ESP. Further, in a case where the sum of the auxiliary equipment electric power Pho (which is a positive value), the cruise electric power Pcr (which is a positive value), the generated electric power Pge (which is a negative value), and the path electric power Ppas (which is a positive value) is positive, the burden electric power (P1=Pho+Pcr+Pge+Ppas), which is a positive value, is discharged from the first battery ESE; and in a case where the above-described sum is negative, the burden electric power (P1=Pho+Pcr+Pge+Ppas), which is a negative value, is charged to the first battery ESE.

With reference back to FIG. 3, the charge and discharge control part 78 transmits a control signal to the gate drive circuit 6 to control the electric power conversion circuit 3 so that the distribution mode determined by the electric power distribution setting part 77 as described above is realized.

In the vehicle V according to the present embodiment, the following effects are obtained.

(1) In the vehicle V, the control device 5 of the electric power conversion circuit 3 controls the electric power conversion circuit 3 so that, during the powering operation, at least a part of the inertial electric power Pin, which is the electric power necessary for changing the vehicle speed, is discharged from the second battery ESP of the output type, and the remaining electric power obtained by subtracting the burden share of the second battery ESP from the requested electric power Ptot with respect to batteries ESE and ESP is discharged from the first battery ESE of the capacitive type; and it controls the electric power conversion circuit 3 so that, during the regenerative operation, the regenerative electric power Pre, which is the electric power generated by the motor generator M, is charged to the second battery ESP. That is, at least a part of the inertial electric power Pin is discharged from the second battery ESP during the powering operation, and the electric power generated by the motor generator M is charged to the second battery ESP during the regenerative operation. As described above, the electric power generated during the regenerative operation is smaller than the electric power necessary for changing the vehicle speed during the powering operation by the loss amount. Therefore, in the vehicle V, with this loss amount taken into consideration, not all but at least a part of the electric power necessary for changing the vehicle speed is discharged from the second battery ESP during the powering operation. Therefore, in the vehicle V, the balance of the electric power of the second battery ESP during the period when the vehicle V starts traveling from a stationary state until the vehicle V becomes stationary after the traveling can be made substantially at 0 with various losses taken into consideration. Therefore, according to the vehicle V, the charge rate of the second battery ESP of the output type can be maintained substantially at a certain value while avoiding the electric power transfer between the first battery ESE and the second battery ESP as much as possible.

(2) In the vehicle V, the burden rate k with respect to the inertial electric power Pin during the powering operation is calculated, and the share according to the burden rate k among the inertial electric power Pin is discharged from the second battery ESP during the powering operation, and the remaining electric power obtained by subtracting the burden share of the second battery ESP from the requested electric power is discharged from the first battery ESE. In this way, the balance of the electric power of the second battery ESP can be made close to 0. Further, in the vehicle V, the burden rate k is calculated based on the estimated value SOC2 of the charge rate of the second battery ESP. In this way, even in a case where the balance of the electric power of the second battery ESP is outside 0, the charge rate of the second battery ESP can be prevented from falling significantly outside the predetermined target.

(3) in the vehicle V, the burden rate k is set to a greater value as the estimated value SOC2 of the charge rate of the second battery ESP increases. In this way, since the charge rate of the second battery ESP is maintained at the predetermined target, the balance of the electric power of the second battery ESP can be controlled.

(4) In the vehicle V, the requested electric power is calculated by summing the inertial electric power Pin, which is the electric power that needs to be supplied to the motor generator M for realizing the acceleration motion under the non-action of the travel resistance; the cruise electric power Per, which is the electric power that needs to be supplied to the motor generator M for maintaining the vehicle speed under the action of the travel resistance; and the auxiliary equipment electric power Pho, which is the electric power that needs to be supplied to vehicle auxiliary equipment. In this way, the electric power necessary for the vehicle V during the powering operation can be covered by the batteries ESE and ESP while the balance of the electric power of the second battery ESP is being made close to 0.

(5) In the vehicle V, during the electric power generation by the generator G different from the motor generator M, the electric power generated by the generator G using the power of the engine E is charged to the first battery ESE, and the first battery ESE is maintained at a predetermined charge state. In this way, the charge rates of the first battery ESE and the second battery ESP can be maintained substantially at a certain value while avoiding the electric power transfer between the first battery ESE and the second battery ESP as much as possible.

(6) In the vehicle V, in a case where the estimated value SOC2 of the charge rate of the second battery ESP is less than or equal to a predetermined threshold value, at least one of the electric power generated by the generator G and the electric power of the first battery ESE is charged to the second battery ESP. In this way, it is possible to avoid a situation where the charge rate of the second battery ESP significantly decreases and cannot realize the acceleration according to a request of the driver.

(7) In the vehicle V, the requested electric power is calculated by subtracting the generated electric power Pge, which is the electric power generated by the generator G, from the electric power obtained by summing the inertial electric power Pin, which is the electric power that needs to be supplied to the motor generator M for realizing the acceleration motion under the non-action of the travel resistance, the cruise electric power Per, which is the electric power that needs to be supplied to the motor generator M for maintaining the vehicle speed under the action of the travel resistance, and the auxiliary equipment electric power Pho, which is the electric power that needs to be supplied to vehicle auxiliary equipment. In this way, the electric power necessary for the vehicle V during the powering operation can be covered by the batteries ESE and ESP and the generator G while the balance of the electric power of the second battery ESP is being made close to 0.

(8) In the vehicle V, the vehicle auxiliary equipment 4 is connected to the first power lines 21p and 21n, which are for connecting the first battery ESE and the electric power conversion circuit 3, and the electric power necessary for driving the vehicle auxiliary equipment 4 is supplied from the first battery ESE. In this way, it is possible to avoid a case where the electric power is supplied from the second battery ESP to the vehicle auxiliary equipment 4, the balance of the electric power of the second battery ESP is turned to the minus side, and thus the charge rate of the second battery ESP falls significantly below the predetermined target.

The embodiment of the disclosure has been described above, but the disclosure is not limited thereto. The configuration of the details may be appropriately modified within the scope of the effects of the disclosure.

For example, in the above embodiment, the electric power path request determination part 73 requests the execution of the electric power path in a case where the estimated value SOC2 of the charge rate of the second battery ESP is less than or equal to the lower limit threshold value so that the electric power is supplied from the first battery ESE to the second battery ESP accordingly, but the disclosure is not limited thereto. The electric power path request determination part 73 may request the electric power generation by the generator G in a case where the estimated value SOC2 is less than or equal to the lower limit threshold value so that the electric power generated by the generator G is supplied to the second battery ESP.

What is claimed is:
1. An electric vehicle, comprising:
a first electric storage device;
a second electric storage device having an output weight density higher than that of the first electric storage device and an energy weight density lower than that of the first electric storage device;
a motor generator connected to a drive wheel;
an electric power conversion circuit which is provided with power lines for connecting the first electric storage device and the second electric storage device to the motor generator;
a control device for driving the electric power conversion circuit and controlling charges and discharges of the first electric storage device and the second electric storage device; and
a requested electric power calculation part for calculating requested electric power which is electric power requested by discharging all the electric storage devices including the first electric storage device and the second electric storage device during a powering operation of the motor generator,
wherein the control device
drives the electric power conversion circuit so that, during the powering operation, at least a part of electric power necessary for changing a vehicle speed among the requested electric power is discharged from the second electric storage device, and remaining electric power obtained by subtracting the electric power discharged from the second electric storage device from the requested electric power is discharged from the first electric storage device;
drives the electric power conversion circuit so that, during a regenerative operation of the motor generator, electric power generated by the motor generator is charged to the second electric storage device;
a second charge state parameter obtaining part for obtaining a second charge state parameter value correlated with a charge state of the second electric storage device; and
a burden rate setting part for setting a burden rate, which is a ratio of a burden share of the second electric storage device with respect to the electric power necessary for changing the vehicle speed, based on the second charge state parameter value,
wherein the control device drives the electric power conversion circuit so that, during the powering operation, a share according to the burden rate among the electric power necessary for changing the vehicle speed is discharged from the second electric storage device.

2. The electric vehicle according to claim 1, wherein the burden rate setting part sets the burden rate to a greater value as the second charge state parameter value increases.

3. The electric vehicle according to claim 1, wherein the requested electric power calculation part calculates the requested electric power by summing inertial electric power, which is electric power that needs to be supplied to the motor generator for changing the vehicle speed, cruise electric power, which is electric power that needs to be supplied to the motor generator for maintaining the vehicle speed, and auxiliary equipment electric power, which is electric power that needs to be supplied to vehicle auxiliary equipment.

4. The electric vehicle according to claim 2, wherein the requested electric power calculation part calculates the requested electric power by summing inertial electric power, which is electric power that needs to be supplied to the motor generator for changing the vehicle speed, cruise electric power, which is electric power that needs to be supplied to the motor generator for maintaining the vehicle speed, and auxiliary equipment electric power, which is electric power that needs to be supplied to vehicle auxiliary equipment.

5. The electric vehicle according to claim 1, comprising:
an internal combustion engine; and
a generator which is connected to the first electric storage device via the electric power conversion circuit and generates electric power by using power generated by the internal combustion engine,
wherein the control device drives the electric power conversion circuit so that, during electric power generation by the generator, the electric power generated by the generator is charged to the first electric storage device, and the first electric storage device is maintained at a predetermined charge state.

6. The electric vehicle according to claim 2, comprising:
an internal combustion engine; and
a generator which is connected to the first electric storage device via the electric power conversion circuit and generates electric power by using power generated by the internal combustion engine,
wherein the control device drives the electric power conversion circuit so that, during electric power generation by the generator, the electric power generated by the generator is charged to the first electric storage device, and the first electric storage device is maintained at a predetermined charge state.

7. The electric vehicle according to claim 1, comprising:
an internal combustion engine;
a generator which is connected to the first electric storage device via the electric power conversion circuit and generates electric power by using power generated by the internal combustion engine; and
a second charge state parameter obtaining part for obtaining a second charge state parameter value correlated with a charge state of the second electric storage device,
wherein the control device drives the electric power conversion circuit so that, a case where the second charge state parameter value is less than or equal to a predetermined threshold value, at least one of electric power generated by the generator and electric power of the first electric storage device is charged to the second electric storage device.

8. The electric vehicle according to claim 2, comprising:
an internal combustion engine;
a generator which is connected to the first electric storage device via the electric power conversion circuit and generates electric power by using power generated by the internal combustion engine; and
a second charge state parameter obtaining part for obtaining a second charge state parameter value correlated with a charge state of the second electric storage device,
wherein the control device drives the electric power conversion circuit so that, in a case where the second charge state parameter value is less than or equal to a predetermined threshold value, at least one of electric power generated by the generator and electric power of the first electric storage device is charged to the second electric storage device.

9. The electric vehicle according to claim 5, wherein the requested electric power calculation part calculates the requested electric power by subtracting generated electric power, which is electric power generated by the generator, from electric power obtained by summing inertial electric power, which is electric power that needs to be supplied to the motor generator for changing the vehicle speed, cruise electric power, which is electric power that needs to be supplied to the motor generator for maintaining the vehicle speed, and auxiliary equipment electric power, which is electric power that needs to be supplied to vehicle auxiliary equipment.

10. The electric vehicle according to claim 6, wherein the requested electric power calculation part calculates the requested electric power by subtracting generated electric power, which is electric power generated by the generator, from electric power obtained by summing inertial electric power, which is electric power that needs to be supplied to the motor generator for changing the vehicle speed, cruise electric power, which is electric power that needs to be supplied to the motor generator for maintaining the vehicle speed, and auxiliary equipment electric power, which is electric power that needs to be supplied to vehicle auxiliary equipment.

11. The electric vehicle according to claim 7, wherein the requested electric power calculation part calculates the requested electric power by subtracting generated electric power, which is electric power generated by the generator, from electric power obtained by summing inertial electric power, which is electric power that needs to be supplied to the motor generator for changing the vehicle speed, cruise electric power, which is electric power that needs to be supplied to the motor generator for maintaining the vehicle speed, and auxiliary equipment electric power, which is electric power that needs to be supplied to vehicle auxiliary equipment.

12. The electric vehicle according to claim 8, wherein the requested electric power calculation part calculates the requested electric power by subtracting generated electric power, which is electric power generated by the generator, from electric power obtained by summing inertial electric power, which is electric power that needs to be supplied to the motor generator for changing the vehicle speed, cruise electric power, which is electric power that needs to be supplied to the motor generator for maintaining the vehicle speed, and auxiliary equipment electric power, which is electric power that needs to be supplied to vehicle auxiliary equipment.

13. An electric vehicle, comprising:
a first electric storage device;
a second electric storage device having an output weight density higher than that of the first electric storage device and an energy weight density lower than that of the first electric storage device;
a motor generator connected to a drive wheel;
an electric power conversion circuit which is provided with power lines for connecting the first electric storage device and the second electric storage device to the motor generator;
a control device for driving the electric power conversion circuit and controlling charges and discharges of the first electric storage device and the second electric storage device; and
a requested electric power calculation part for calculating requested electric power which is electric power requested by discharging all the electric storage devices including the first electric storage device and the second electric storage device during a powering operation of the motor generator,
wherein the control device
drives the electric power conversion circuit so that, during the powering operation, at least a part of electric power necessary for changing a vehicle speed among the requested electric power is discharged from the second electric storage device, and remaining electric power obtained by subtracting the electric power discharged from the second electric storage device from the requested electric power is discharged from the first electric storage device; and
drives the electric power conversion circuit so that, during a regenerative operation of the motor generator, electric power generated by the motor generator is charged to the second electric storage device,
wherein the requested electric power calculation part calculates the requested electric power by summing inertial electric power, which is electric power that needs to be supplied to the motor generator for changing the vehicle speed, cruise electric power, which is electric power that needs to be supplied to the motor generator for maintaining the vehicle speed, and auxiliary equipment electric power, which is electric power that needs to be supplied to vehicle auxiliary equipment.

14. The electric vehicle according to claim 13, further comprising:
first power lines for connecting the first electric storage device and the electric power conversion circuit,
wherein the vehicle auxiliary equipment is connected to the first power lines, and
electric power necessary for driving the vehicle auxiliary equipment is supplied from the first electric storage device.

15. An electric vehicle, comprising:
a first electric storage device;
a second electric storage device having an output weight density higher than that of the first electric storage device and an energy weight density lower than that of the first electric storage device;
a motor generator connected to a drive wheel;
an electric power conversion circuit which is provided with power lines for connecting the first electric storage device and the second electric storage device to the motor generator;
a control device for driving the electric power conversion circuit and controlling charges and discharges of the first electric storage device and the second electric storage device; and
a requested electric power calculation part for calculating requested electric power which is electric power requested by discharging all the electric storage devices including the first electric storage device and the second electric storage device during a powering operation of the motor generator;
wherein the control device
drives the electric power conversion circuit so that, during the powering operation, at least a part of electric power necessary for changing a vehicle speed among the requested electric power is discharged from the second electric storage device, and remaining electric power obtained by subtracting the electric power discharged from the second electric storage device from the requested electric power is discharged from the first electric storage device;
drives the electric power conversion circuit so that, during a regenerative operation of the motor generator, electric power generated by the motor generator is charged to the second electric storage device;
the electric vehicle further comprising:
an internal combustion engine; and
a generator which is connected to the first electric storage device via the electric power conversion circuit and generates electric power by using power generated by the internal combustion engine,
wherein the requested electric power calculation part calculates the requested electric power by subtracting generated electric power, which is electric power generated by the generator, from electric power obtained by summing inertial electric power, which is electric power that needs to be supplied to the motor generator for changing the vehicle speed, cruise electric power, which is electric power that needs to be supplied to the motor generator for maintaining the vehicle speed, and auxiliary equipment electric power, which is electric power that needs to be supplied to vehicle auxiliary equipment.

16. The electric vehicle according to claim 15, further comprising:
first power lines for connecting the first electric storage device and the electric power conversion circuit,
wherein the vehicle auxiliary equipment is connected to the first power lines, and
electric power necessary for driving the vehicle auxiliary equipment is supplied from the first electric storage device.

17. The electric vehicle according to claim 15,
wherein the control device drives the electric power conversion circuit so that, during electric power generation by the generator, the electric power generated by the generator is charged to the first electric storage device, and the first electric storage device is maintained at a predetermined charge state.

18. The electric vehicle according to claim 15, comprising:
a second charge state parameter obtaining part for obtaining a second charge state parameter value correlated with a charge state of the second electric storage device,
wherein the control device drives the electric power conversion circuit so that, in a case where the second charge state parameter value is less than or equal to a predetermined threshold value, at least one of electric power generated by the generator and electric power of the first electric storage device is charged to the second electric storage device.

* * * * *